United States Patent
Okumura et al.

(10) Patent No.: US 8,709,926 B2
(45) Date of Patent: Apr. 29, 2014

(54) PLASMA DOPING METHOD AND PLASMA DOPING APPARATUS

(75) Inventors: Tomohiro Okumura, Kadoma (JP); Ichiro Nakayama, Kadoma (JP); Bunji Mizuno, Ikoma (JP); Yuichiro Sasaki, Kawasaki (JP)

(73) Assignee: Panasonic Corporation, Osaka (JP)

( * ) Notice: Subject to any disclaimer, the term of this patent is extended or adjusted under 35 U.S.C. 154(b) by 199 days.

(21) Appl. No.: 12/952,807

(22) Filed: Nov. 23, 2010

(65) Prior Publication Data

US 2011/0065267 A1    Mar. 17, 2011

Related U.S. Application Data

(62) Division of application No. 11/531,637, filed on Sep. 13, 2006, now Pat. No. 7,863,168, which is a division of application No. 10/675,922, filed on Sep. 29, 2003, now abandoned.

(30) Foreign Application Priority Data

Oct. 2, 2002  (JP) .................................. 2002-290074
Oct. 2, 2002  (JP) .................................. 2002-290075
Oct. 2, 2002  (JP) .................................. 2002-290076

(51) Int. Cl.
  *H01L 21/265* (2006.01)
  *H01L 21/223* (2006.01)
(52) U.S. Cl.
  CPC ................................. *H01L 21/2236* (2013.01)
  USPC .................................. 438/513; 257/E21.334
(58) Field of Classification Search
  CPC ................................................. H01L 21/2236
  USPC ............................. 438/513, 515; 257/E21.334
  See application file for complete search history.

(56) References Cited

U.S. PATENT DOCUMENTS 4,374,722 A    2/1983    Zega
4,912,065 A    3/1990    Mizuno et al.
(Continued)

FOREIGN PATENT DOCUMENTS

JP         09115851        5/1997
JP       2000-309868      11/2000
(Continued)

OTHER PUBLICATIONS

Han, "Plasma Heat Treatment", 1997, pp. 43-44, Tienjin University Publisher (Translated Abstract included).

*Primary Examiner* — Mary Wilczewski
(74) *Attorney, Agent, or Firm* — Wenderoth, Lind & Ponack, LLP

(57) ABSTRACT

In order to realize a plasma doping method capable of carrying out a stable low-density doping, exhaustion is carried out with a pump while introducing a predetermined gas into a vacuum chamber from a gas supplying apparatus, the pressure of the vacuum chamber is held at a predetermined pressure and a high frequency power is supplied to a coil from a high frequency power source. After the generation of plasma in the vacuum chamber, the pressure of the vacuum chamber is lowered, and the low-density plasma doping is performed to a substrate placed on a substrate electrode. Moreover, the pressure of the vacuum chamber is gradually lowered, and the high frequency power is gradually increased, thereby the low-density plasma doping is carried out to the substrate placed on the substrate electrode. Furthermore, a forward power Pf and a reflected power Pr of the high frequency power supplied to the substrate electrode are sampled at a high speed, and when a value of which the power difference Pf-Pr is integrated with respect to time reaches a predetermined value, the supply of the high frequency power is suspended.

1 Claim, 15 Drawing Sheets

(56) References Cited

U.S. PATENT DOCUMENTS

| | | | |
|---|---|---|---|
| 4,951,009 | A | 8/1990 | Collins |
| 5,065,118 | A | 11/1991 | Collins et al. |
| 5,134,965 | A * | 8/1992 | Tokuda et al. ........ 118/723 MW |
| 5,404,079 | A * | 4/1995 | Ohkuni et al. ............ 315/111.81 |
| 5,424,905 | A * | 6/1995 | Nomura et al. ................ 361/235 |
| 5,556,549 | A | 9/1996 | Patrick et al. |
| 5,574,410 | A | 11/1996 | Collins et al. |
| 5,635,021 | A * | 6/1997 | Harafuji ........................ 438/714 |
| 5,643,364 | A | 7/1997 | Zhao et al. |
| 5,688,357 | A | 11/1997 | Hanawa |
| 5,688,410 | A * | 11/1997 | Kajitani et al. .................. 216/64 |
| 5,851,906 | A | 12/1998 | Mizuno et al. |
| 5,946,587 | A | 8/1999 | Fujioka et al. |
| 6,110,287 | A * | 8/2000 | Arai et al. ................. 156/345.34 |
| 6,211,749 | B1 | 4/2001 | Yuzurihara et al. |
| 6,291,938 | B1 | 9/2001 | Jewett et al. |
| 6,300,227 | B1 | 10/2001 | Liu et al. |
| 6,403,453 | B1 | 6/2002 | Ono et al. |
| 6,628,349 | B1 * | 9/2003 | Takei et al. ...................... 349/43 |
| 6,754,552 | B2 | 6/2004 | Nishiumi et al. |
| 7,109,098 | B1 | 9/2006 | Ramaswamy et al. |
| 7,192,854 | B2 | 3/2007 | Sasaki et al. |
| 7,402,526 | B2 | 7/2008 | Rueger |
| 7,456,085 | B2 | 11/2008 | Sasaki et al. |
| 7,537,672 | B1 * | 5/2009 | Koshiishi et al. ......... 156/345.47 |
| 7,686,928 | B2 | 3/2010 | Gung |
| 7,771,564 | B2 * | 8/2010 | Yokogawa et al. ...... 156/345.53 |
| 7,863,168 | B2 * | 1/2011 | Okumura et al. .............. 438/513 |
| 2002/0139477 | A1 | 10/2002 | Ni et al. |
| 2004/0149219 | A1 | 8/2004 | Okumura et al. |
| 2005/0061445 | A1 * | 3/2005 | Koshiishi et al. ......... 156/345.47 |
| 2005/0205212 | A1 | 9/2005 | Singh et al. |
| 2006/0236931 | A1 | 10/2006 | Singh et al. |
| 2007/0026649 | A1 * | 2/2007 | Okumura et al. .............. 438/510 |
| 2008/0146009 | A1 | 6/2008 | Sasaki et al. |
| 2008/0233723 | A1 | 9/2008 | Okumura et al. |
| 2008/0308041 | A1 * | 12/2008 | Koshiishi et al. ............. 118/715 |
| 2009/0233383 | A1 * | 9/2009 | Okumura et al. .................. 438/7 |
| 2010/0326601 | A1 * | 12/2010 | Koshiishi et al. ......... 156/345.44 |
| 2011/0065267 | A1 * | 3/2011 | Okumura et al. .............. 438/513 |

FOREIGN PATENT DOCUMENTS

| | | |
|---|---|---|
| JP | 2002-170783 | 6/2002 |
| JP | 2002-203843 | 7/2002 |
| JP | 2004-128209 | 4/2004 |
| KR | 307998 | 12/2001 |

* cited by examiner

US 8,709,926 B2

PLASMA DOPING METHOD AND PLASMA DOPING APPARATUS

CROSS REFERENCE TO RELATED APPLICATION

This application is a divisional from U.S. patent application Ser. No. 11/531,637 filed Sep. 13, 2006, which is a divisional from U.S. patent application Ser. No. 10/675,922 filed Sep. 29, 2003, which claims the benefit of priority under 35 USC 119 to Japanese Patent Application Serial No. 2002-290074, filed Oct. 2, 2002 and Japanese Patent Application Serial No. 2002-290075, filed Oct. 2, 2002, and Japanese Patent Application Serial No. 2002-290075, filed Oct. 2, 2002.

BACKGROUND OF THE INVENTION

The present invention relates to a plasma doping method for doping impurities into the surface of a solid sample such as a semiconductor substrate, and to an apparatus for implementing this method.

A technique for doping impurities into the surface of a solid sample is disclosed, for example, in the prior art of the U.S. Pat. No. 4,912,065, wherein a plasma doping method is implemented such that impurities are ionized and then doped into a solid material at a low energy.

A plasma doping method of the prior art method for doping impurities is described below with reference to FIG. 14.

FIG. 14 shows a schematic configuration of a plasma doping apparatus used in the prior art plasma doping method. In FIG. 14, a vacuum chamber 100 accommodates a sample electrode 106 for placing a sample (work) 109 such as a silicon substrate thereon. A gas supplying apparatus 102 for supplying doping material gas such as $B_2H_6$ containing a desired element and a pump 103 for evacuating the vacuum chamber 100 are provided outside the vacuum chamber 100. These apparatuses allow the vacuum chamber 100 to be maintained at a predetermined pressure. A microwave is emitted from a microwave waveguide 119 into the vacuum chamber 100 through a quartz plate 107 as a dielectric window. By a mutual action of this microwave and a DC magnetic field generated by an electric magnet 114, electron cyclotron resonance plasma is produced within a region encompassed by a dash-dotted line 120 in the vacuum chamber 100. The sample electrode 106 is connected to a high frequency power supply 110 through a capacitor 121, so that the electric potential of the sample electrode 106 is controlled.

In the plasma doping apparatus having the above-mentioned configuration, the doping material gas such as $B_2H_6$ introduced in the vacuum chamber 100 from the gas supplying apparatus 102 is made into the plasma state by plasma generating means comprising the microwave waveguide 119 and the electric magnet 114, so that boron ions in the plasma 120 are doped into the surface of the sample 109 by means of the electric potential provided from the high frequency power supply 110.

On the sample 109 doped with the impurities as mentioned above, a metallic wiring layer is formed in another process. Then, a thin oxide film is formed on the metallic wiring layer in a predetermined oxidizing atmosphere. After that, gate electrodes are formed on the sample 109 by a CVD apparatus and the like, so that MOS transistors, for example, are obtained.

The doping material gas such as $B_2H_6$ containing impurities express electrical activity when doped into a sample such as a silicon substrate, however there is a problem that such a gas is generally hazardous for human body.

Further, in the plasma doping method, all of the substances contained in the doping material gas are doped into the sample. Description is made in the case of the doping material gas composed of $B_2H_6$, for example. Only the boron works as effective impurities in the doped state, however hydrogen is also doped into the sample simultaneously. This doping of hydrogen into the sample causes the problem that lattice defects are generated during the subsequent heat treatment such as an epitaxial growth process.

For the purpose of resolving these problems, in another prior art method disclosed in JP-A Hei 09-115851, an impurity solid material containing the substance of impurities that express electrical activity when doped into a sample is placed in a vacuum chamber, while inert gas plasma is generated in the vacuum chamber. The impurities are emitted from the impurity solid material and are sputtered by the ions of the inert gas plasma. FIG. 15 shows the configuration of a plasma doping apparatus used in this prior art plasma doping method. In FIG. 15, a vacuum chamber 100 accommodates a sample electrode 106 for placing a sample 109 composed of a silicon substrate thereon. A gas supplying apparatus 102 for supplying the inert gas and a pump 103 for evacuating the vacuum chamber 100 are disposed outside the vacuum chamber 100. These apparatuses allow the vacuum chamber 100 to be maintained at a predetermined pressure. A microwave is emitted from a microwave waveguide 119 into the vacuum chamber 100 through a quartz plate 107 as a dielectric window. Due to a mutual action of the microwave and a DC magnetic field generated by an electric magnet 114, the electron cyclotron resonance plasma is produced within a region encompassed by a dash-dotted line 120 in the vacuum chamber 100. The sample electrode 106 is connected through a capacitor 121 to a high frequency power supply 110, so that the electric potential of the sample electrode 106 is controlled. An impurity solid material 122 containing impurity element such as boron is placed on a solid material holding bed 123. The electric potential of the solid material holding bed 123 is controlled by a high frequency power supply 125 connected thereto via a capacitor 124.

In the plasma doping apparatus having the above-mentioned configuration, the inert gas such as argon (Ar) introduced from the gas supplying apparatus 102 is ionized into the plasma state by plasma generating means comprising the microwave waveguide 119 and the electric magnet 114. A part of impurity atoms sputtered from the impurity solid material 122 into the plasma 120 are ionized and then doped into the surface of the sample 109.

Nevertheless, both of the above-mentioned prior art methods shown in FIG. 14 and FIG. 15 still have the problem that low density doping is not achieved stably and that the reproducibility of the processing is poor. When low density doping is performed using the doping material gas, it is required that the pressure of the vacuum chamber is reduced, and the partial pressure of the doping material gas is made low. For the purpose of the latter, in general, the doping material gas is diluted with helium, which is an inert gas. This is because helium ions have a lower sputtering yield and hence have the advantage that ion irradiation damage to the sample caused by the ions is suppressed. Nevertheless, helium also has the disadvantage that the start of its discharge is difficult at lower pressures. There is a difficulty in processing in desired low doping conditions.

Similarly, even when low density doping is performed using the impurity solid material in place of the doping material gas, the pressure of the vacuum chamber is reduced. In the case that argon is used as the inert gas, although the start of discharge at lower pressures is easier than the case of helium, processing in desired low density doping conditions is still difficult. This difficulty is essentially the same as the case of the use of the doping material gas.

On the other hand, JP-A 2000-309868 discloses a method in a sputtering apparatus using argon gas, wherein the pressure of the vacuum chamber is increased in a plasma generating step, so as to ensure the generation of the plasma. Nevertheless, this method is required to raise the pressure, and is not directly applicable to the plasma doping process, which is extremely sensitive to impurities.

An effective method for improving the generation-quality is to change discharge conditions so as to increase the pressure of the vacuum chamber in the generation step, and to decrease the pressure in the doping step. Nevertheless, the change in the pressure causes a substantial change in the discharge impedance. This impedance change cannot be sufficiently rapidly tracked by a matching circuit used for impedance matching of the high frequency electric power. This causes a problem of the generation of a large reflected power. More specifically, a typical matching circuit comprises, as variable impedance elements, two variable capacitors (or stubs in case of a microwave) having a mechanical section which is driven by a motor. Thus, impedance matching adjustment typically takes one second or longer because of the mechanical rotation by the motor. The reflected power degrades the reproducibility of the processing. The reflected power is liable to generate a noise and hence erroneous operation of apparatuses occurs. In a worse case, the rotation (movement) of the variable capacitors (stubs) overruns the appropriate position, and causes the extinction of the plasma.

Further, once a microwave or a high frequency electric power is supplied to the plasma doping apparatus, the matching circuit provided between the high frequency power supply and the plasma generating apparatus or the sample electrode begins to operate. At that time, it takes generally several 100 milliseconds through several seconds from the start of operation of the matching circuit to its achievement of the full suppression of reflected power. Further, this necessary time varies in each of the repeated processes, and hence degrades the controllability and reproducibility. There is a difficulty in obtaining stably a desired doping density.

In particular, in the case of low density doping at a doping density of $1 \times 10^{11}$ atm/cm$^2$ through $1 \times 10^{15}$ atm/cm$^2$, the processing time is as short as several seconds through ten and several seconds. Accordingly, the processing is affected strongly by the variation in the reflected power.

Furthermore, when at least one of control parameters, such as gas species, gas flow rate, pressure and high frequency electric power is changed during the process of plasma doping with maintaining the generation of plasma, a large reflected power is liable to occur at the time of change. Variation in this reflected power is large, and thus the controllability and reproducibility in the doping density are degraded.

BRIEF SUMMARY OF THE INVENTION

An object of the invention is to provide a plasma doping method permitting stable low density doping and an apparatus for implementing the method.

An aspect of the invention is a plasma doping method for doping impurities into a sample or into a film on the surface of the sample, comprising: a first step of placing a sample on a sample electrode in a vacuum chamber; a second step of evacuating the vacuum chamber with supplying a doping material gas into the vacuum chamber, and supplying high frequency electric power to a plasma source with controlling the pressure of the vacuum chamber at a first pressure so as to generate plasma in the vacuum chamber; and a third step of controlling the pressure of the vacuum chamber into a second pressure lower than the first pressure with maintaining the generation of the plasma.

According to this plasma doping method of the invention, the vacuum chamber is evacuated with supplying a doping material gas into the vacuum chamber, and a high frequency electric power is supplied to a plasma source with controlling the pressure of the vacuum chamber at a first pressure so as to generate plasma in the vacuum chamber. In this state, the pressure of the vacuum chamber is controlled into a second pressure lower than the first pressure. This provides a plasma doping method permitting stable low density doping.

Another aspect of the invention is a plasma doping method for doping impurities into a sample or into a film on the surface of the sample, comprising: a first step of placing a sample on a sample electrode in a vacuum chamber; a second step of evacuating the vacuum chamber with supplying a gas containing an inert gas other than helium into the vacuum chamber, and supplying high frequency electric power to a plasma source with controlling the pressure of the vacuum chamber at a first pressure so as to generate plasma in the vacuum chamber; and a third step of evacuating the vacuum chamber with supplying a gas containing helium into the vacuum chamber with maintaining the generation of the plasma, so as to control the pressure of the vacuum chamber into a second pressure.

According to this plasma doping method of the invention, the vacuum chamber is evacuated with supplying a gas containing an inert gas other than helium into the vacuum chamber, and a high frequency electric power is supplied to a plasma source with controlling the pressure of the vacuum chamber at a first pressure so as to generate plasma in the vacuum chamber. In this state, the vacuum chamber is evacuated with supplying a gas containing helium into the vacuum chamber so as to control the pressure of the vacuum chamber into a second pressure. This provides a plasma doping method permitting stable low density doping.

Another aspect of the invention is a plasma doping method for doping impurities into a sample or into a film on the surface of the sample, comprising: a first step of placing a sample on a sample electrode in a vacuum chamber; a second step of evacuating the vacuum chamber with supplying a gas into the vacuum chamber, and supplying high frequency electric power to a plasma source with controlling the pressure of the vacuum chamber at a first pressure so as to generate plasma in the vacuum chamber; and a third step of controlling the pressure of the vacuum chamber into a second pressure with maintaining the generation of the plasma, and supplying high frequency electric power larger than that of the second step to the plasma source.

According to this plasma doping method of the invention, the vacuum chamber is evacuated with supplying a gas into the vacuum chamber, and a high frequency electric power is supplied to a plasma source with controlling the pressure of the vacuum chamber at a first pressure so as to generate plasma in the vacuum chamber. In this state, the pressure of the vacuum chamber is controlled into a second pressure and a high frequency electric power larger than that at the generation of the plasma is supplied to the plasma source. This provides a plasma doping method permitting stable low density doping.

Another aspect of the invention is a plasma doping method for doping impurities into a sample or into a film on the surface of the sample, comprising: a first step of placing a sample on a sample electrode in a vacuum chamber; a second step of evacuating the vacuum chamber with supplying a gas not containing a doping material gas into the vacuum chamber, and supplying high frequency electric power to a plasma source with controlling the pressure of the vacuum chamber at a first pressure so as to generate plasma in the vacuum chamber; and a third step of evacuating the vacuum chamber with supplying a gas containing a doping material gas into the vacuum chamber with maintaining the generation of the plasma, so as to control the pressure of the vacuum chamber into a second pressure different from the first pressure.

According to this plasma doping method of the invention, the vacuum chamber is evacuated with supplying a gas not containing a doping material gas into the vacuum chamber, and a high frequency electric power is supplied to a plasma source with controlling the pressure of the vacuum chamber at a first pressure so as to generate plasma in the vacuum chamber. In this state, the vacuum chamber is evacuated with supplying a gas containing a doping material gas into the vacuum chamber so as to control the pressure of the vacuum chamber into a second pressure. This provides a plasma doping method permitting stable low density doping.

Another aspect of the invention is a plasma doping method, wherein a vacuum chamber comprising a plasma generating apparatus is evacuated with supplying a gas into the vacuum chamber, and high frequency electric power is supplied to the plasma generating apparatus via a matching circuit for plasma generating apparatus comprising toroidal cores serving as two variable impedance elements without any mechanically moving section. Thereby plasma is generated in the vacuum chamber, and impurities are doped into a sample placed on a sample electrode in the vacuum chamber or into a film on the surface of the sample. In the plasma doping method, at least one of control parameters, such as gas species, gas flow rate, pressure, and high frequency electric power is changed with maintaining the generation of plasma.

According to this plasma doping method of the invention, a high frequency electric power is supplied to the plasma generating apparatus via a matching circuit for plasma generating apparatus comprising toroidal cores serving as two variable impedance elements. Thereby plasma is generated in the vacuum chamber. In this state, at least one of control parameters, such as gas species, gas flow rate, pressure, and high frequency electric power is changed. This provides a plasma doping method permitting stable low density doping with excellent reproducibility.

Another aspect of the invention is a plasma doping method, wherein a vacuum chamber comprising a plasma generating apparatus is evacuated with supplying a gas into the vacuum chamber, and a high frequency electric power is supplied to the plasma generating apparatus via a matching circuit for plasma generating apparatus. Thereby plasma is generated in the vacuum chamber, and impurities are doped into a sample placed on a sample electrode in the vacuum chamber or into a film on the surface of the sample. In the plasma doping method, at least one of control parameters, such as gas species, gas flow rate, pressure, and high frequency electric power is changed gradually in 1 seconds through 5 seconds with maintaining the generation of plasma.

According to this plasma doping method of the invention, a high frequency electric power is supplied to the plasma generating apparatus via a matching circuit for plasma generating apparatus, whereby plasma is generated in the vacuum chamber, and impurities are doped into the surface of the sample. Then, at least one of control parameters, such as gas species, gas flow rate, pressure, and high frequency electric power is changed gradually in 1 second through 5 seconds with maintaining the generation of plasma. This provides a plasma doping method permitting stable low density doping with excellent reproducibility.

The plasma doping methods according to the inventions are useful especially in the case that at least one of control parameters, such as gas species, gas flow rate, pressure, and high frequency electric power is changed during the process of plasma doping with maintaining the generation of plasma.

Another aspect of the invention is a plasma doping method, wherein a vacuum chamber comprising a plasma generating apparatus is evacuated with supplying a gas into the vacuum chamber. A high frequency electric power is supplied to the plasma generating apparatus so as to generate plasma in the vacuum chamber, and a high frequency electric power is supplied to a sample electrode in the vacuum chamber, whereby impurities are doped into the sample placed on the sample electrode in the vacuum chamber or into a film on the surface of the sample. When a forward power of the high frequency electric power supplied to the plasma generating apparatus or the sample electrode is denoted by Pf and the reflected power thereof is denoted by Pr, the power difference Pf-Pr is sampled in intervals of 1 millisecond through 100 milliseconds, and when the integration of the power difference Pf-Pr with respect to time reaches a predetermined value, the supply of the high frequency electric power is stopped.

According to this plasma doping method of the invention, when a forward power of the high frequency electric power supplied to the plasma generating apparatus or the sample electrode is denoted by Pf and the reflected power thereof is denoted by Pr, the power difference Pf-Pr is sampled in intervals of 1 millisecond through 100 milliseconds. When the integration of the power difference Pf-Pr with respect to time reaches a predetermined value, the supply of the high frequency electric power is stopped. This provides a plasma doping method excellent in the controllability and reproducibility of the doping density.

A plasma doping apparatus of the present invention comprising: a vacuum chamber; a gas supplying apparatus for supplying a gas into the vacuum chamber; an evacuating apparatus for evacuating the vacuum chamber; a regulating valve for controlling the pressure of the vacuum chamber into a predetermined value; a sample electrode for placing a sample in the vacuum chamber; a plasma generating apparatus; a matching circuit for plasma generating apparatus comprising toroidal cores serving as two variable impedance elements without a mechanical moving-section and a high frequency power supply for supplying high frequency electric power to the plasma generating apparatus via the matching circuit for plasma generating apparatus.

According to this plasma doping apparatus according to the invention, a high frequency power supply is provided such as to supply high frequency electric power to a plasma generating apparatus via a matching circuit for plasma generating apparatus comprising toroidal cores serving as two variable impedance elements without any mechanically moving section. This permits stable low density doping and excellently reproducible plasma doping.

Another aspect of a plasma doping apparatus of the present invention comprising: a vacuum chamber; a gas supplying apparatus for supplying a gas into the vacuum chamber; an evacuating apparatus for evacuating the vacuum chamber; a regulating valve for controlling the pressure of the vacuum chamber into a predetermined value; a sample electrode for placing a sample in the vacuum chamber; a plasma generating apparatus; a high frequency power supply for supplying high frequency electric power to the plasma generating apparatus;

a high frequency power supply for supplying high frequency electric power to the sample electrode. This plasma doping apparatus further comprises: a sampler, when the forward power of the high frequency electric power supplied to the plasma generating apparatus or the sample electrode is denoted by Pf and when the reflected power thereof is denoted by Pr, samples the power difference Pf-Pr in intervals of 1 millisecond through 100 milliseconds; and a controlling apparatus, when the integration of the power difference Pf-Pr with respect to time reaches a predetermined value, stops the supply of the high frequency electric power.

According to the plasma doping apparatus of the invention, the power difference Pf-Pr is sampled in every interval of 1 millisecond through 100 milliseconds, while when the integration of the power difference Pf-Pr with respect to time reaches a predetermined value, the supply of the high frequency electric power is stopped. This provides a plasma doping apparatus excellent in the controllability and reproducibility of the doping density.

BRIEF DESCRIPTION OF THE SEVERAL VIEWS OF THE DRAWINGS

FIG. 14 is the cross sectional view of the plasma doping apparatus for implementing the prior art plasma doping method; and FIG. 15 is the cross sectional view of another example of the plasma doping apparatus for implementing the prior art plasma doping method.

DETAILED DESCRIPTION OF THE INVENTION

Preferred embodiments of the invention are described below in detail with reference to FIG. 1 through FIG. 13.

First Embodiment

A plasma doping method according to a first embodiment of the present invention is described below with reference to FIG. 1.

Figure 1:
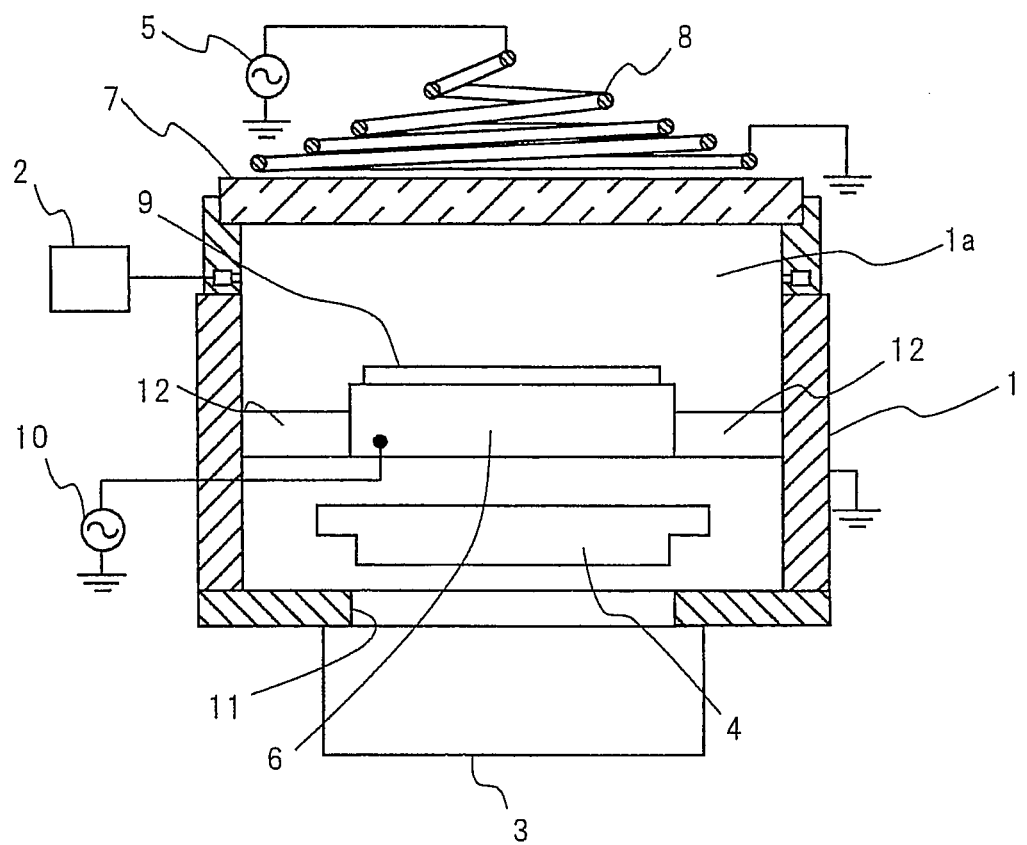
FIG. 1 is a cross sectional view of a plasma doping apparatus for implementing a plasma doping method according to first through fourth embodiments of the invention.

FIG. 1 is a cross sectional view of a plasma doping apparatus for implementing a plasma doping method according to the first embodiment of the invention. In FIG. 1, a predetermined gas is continuously introduced from a gas supplying apparatus 2 into the internal space 1a of a vacuum chamber 1, while the vacuum chamber 1 is evacuated by a turbo molecular pump 3 serving as an evacuating apparatus. In the state that the pressure of the internal space 1a of the vacuum chamber 1 is maintained at a predetermined value by means of a regulating valve 4, a high frequency electric power of 13.56 MHz is supplied from a high frequency power supply 5 to a spiral coil 8 provided in the vicinity of a dielectric window 7 opposing to a sample electrode 6. According to this configuration, plasma of an induction coupling type is generated in the internal space 1a of the vacuum chamber 1, so that plasma doping is performed on a silicon substrate 9 as a sample (work to be processed) placed on the sample electrode 6. A high frequency power supply 10 is provided for supplying high frequency electric power to the sample electrode 6. Thus, the high frequency power supply 10 can control the electric potential of the sample electrode 6 such that the substrate 9 has a negative potential relative to the plasma. The turbo molecular pump 3 and an evacuation opening 11 are arranged immediately under the sample electrode 6. The regulating valve 4 is arranged also immediately under the sample electrode 6 but immediately over the turbo molecular pump 3, and serves as a valve for increasing and reducing the pressure. The sample electrode 6 is mounted in the vacuum chamber 1 by four supporting members 12. The dielectric window 7 is composed mainly of quartz glass.

A silicon substrate 9 for work is placed on the sample electrode 6. In the state that the temperature of the sample electrode 6 is maintained at 10° C., helium gas is introduced into the vacuum chamber 1 at the rate of 50 sccm (standard cc/min), and diborane gas ($B_2H_6$) serving as a doping material gas is introduced therein at the rate of 3 sccm. In the state that the pressure of the vacuum chamber 1 is controlled at the first pressure of 3 Pa (Pascal), the high frequency electric power at 800 W of 13.56 MHz is supplied to the coil 8 serving as a plasma source. Then, plasma is generated in the vacuum chamber 1. At one second after the generation of the plasma, in the state that the plasma is generated, the pressure of the vacuum chamber 1 is controlled into a second pressure of 0.3 Pa lower than the first pressure (3 Pa). Once the plasma becomes stable, a high frequency electric power at 200 W (13.56 MHz) is supplied to the sample electrode 6 for 7 seconds. As a result of this process, boron has been doped in the vicinity of the surface of the substrate 9. The doping of boron into a film prepared on the surface of a substrate 9 as the sample is processed similarly. A doping density of $2.5 \times 10^{13}$ atm/cm$^2$ has been obtained.

As described above, the generation of the plasma is performed at a pressure (3 Pa) higher than the pressure (0.3 Pa)

in the doping process. Stable generation of the plasma can be realized. Further, in the above-mentioned process, the plasma is composed mainly of helium causing only a reduced amount of ion irradiation damage to the sample. Therefore, stable low density doping is carried out.

In the step of generating the plasma, an inert gas other than helium may be used as another method. In an inert gas other than helium, a low limit of pressure for generation is lower than in helium. Thus, when an inert gas other than helium is used, the plasma generation can be performed advantageously at a lower pressure than in helium.

In the step of generating the plasma, the high frequency electric power supplied to the plasma source may be reduced. In this case, adverse influence which is given to the substrate 9 during the generation step can be reduced advantageously.

In the step of generating the plasma, the supply of the doping material gas into the vacuum chamber may be stopped. This reduces adverse influence to the substrate 9 during the generation step.

Second Embodiment

A plasma doping method according to a second embodiment of the present invention is described below with reference to FIG. 1, which has been used similarly in the description of the first embodiment. The description made in the first embodiment as to FIG. 1 is applied to the second embodiment similarly.

The configuration and the basic operation of the plasma doping apparatus of FIG. 1 have been described in the first embodiment of the invention, and hence duplicated description is omitted.

In FIG. 1, a substrate 9 is placed on the sample electrode 6. In the state that the temperature of the sample electrode 6 is maintained at 10° C., argon gas is introduced into the vacuum chamber 1 at the rate of 50 sccm, and diborane gas ($B_2H_6$) serving as a doping material gas is introduced at the rate of 3 sccm. In the state that the pressure of the vacuum chamber 1 is controlled at the first pressure of 0.8 Pa, high frequency electric power at 800 W is supplied to the coil 8 serving as a plasma source. Then, plasma is generated in the vacuum chamber 1. At one second after the generation of the plasma, in the state that the plasma is generated, helium gas is introduced into the vacuum chamber 1 at a rate of 50 sccm, whereas the supply of argon gas is stopped. Once the plasma becomes stable, a high frequency electric power at 200 W is supplied to the sample electrode 6 for 7 seconds. As a result of this process, boron has been doped in the vicinity of the surface of the substrate 9. A doping density is $4.2 \times 10^{13}$ atm/cm$^2$.

As mentioned above, a stable generation of the plasma is realizable by using an inert gas (argon, for example) other than helium. After generation of the plasma, the plasma mainly composed of helium is used, which gives a slight ion irradiation damage to the sample. Thereby, a low density doping can be stably carried out.

In the step of generating the plasma in the second embodiment, the pressure of the vacuum chamber may be increased. Thereby, there is an advantage that the plasma is generated stably.

In the step of generating the plasma, the high frequency electric power supplied to the plasma source may be reduced. Thereby, adverse influence to the sample during the generation step is reduced.

In the step of generating the plasma, the supply of the doping material gas into the vacuum chamber may be stopped. Thereby, adverse influence to the sample during the generation step is reduced.

Third Embodiment

A plasma doping method according to a third embodiment of the present invention is described below with reference to FIG. 1. The description made in the first embodiment as to FIG. 1 is applied to the third embodiment similarly.

The configuration and the basic operation of the plasma doping apparatus of FIG. 1 have been described in the first embodiment of the invention, and hence duplicated description is omitted.

In FIG. 1, a substrate 9 is placed on the sample electrode 6. In the state that the temperature of the sample electrode 6 is maintained at 10° C., helium gas is introduced into the vacuum chamber 1 at the rate of 50 sccm, and diborane gas ($B_2H_6$) serving as a doping material gas is introduced at the rate of 3 sccm. In the state that the pressure of the vacuum chamber 1 is controlled at a first pressure of 3 Pa, high frequency electric power at 100 W is supplied to the coil 8 serving as a plasma source. Then, plasma is generated in the vacuum chamber 1. At one second after the generation of the plasma, in the state that the plasma is generated, the pressure of the vacuum chamber 1 is controlled into the second pressure of 0.3 Pa lower than the first pressure (3 Pa), while the high frequency electric power supplied to the coil is increased into 800 W. Once the plasma becomes stable, high frequency electric power at 200 W is supplied to the sample electrode 6 for 7 seconds. As a result of this process, boron has been doped in the vicinity of the surface of the substrate 9. A doping density is $2.4 \times 10^{13}$ atm/cm$^2$.

As mentioned above, in the step of generating the plasma, the electric power supplied to the plasma source is reduced. Thereby, adverse influence to the sample during the generation step can be reduced. The plasma mainly composed of helium is used, which gives a slight ion irradiation damage to the sample. Thereby, a low density doping can be stably carried out.

In the step of generating the plasma in the third embodiment, the second pressure may be identical to the first pressure. Even in this case, adverse influence to the sample is reduced during the generation step.

In the step of generating the plasma, an inert gas other than helium may be supplied. In an inert gas other than helium, a low limit of pressure for plasma generation is lower than in helium. Thus, the plasma generation can be performed advantageously at a lower pressure.

In the step of generating the plasma, the supply of the doping material gas into the vacuum chamber may be stopped. This reduces adverse influence to the sample during the generation step.

Fourth Embodiment

A plasma doping method according to a fourth embodiment of the present invention is described below with reference to FIG. 1. The description made in the first embodiment as to FIG. 1 is applied to the fourth embodiment similarly.

The configuration and the basic operation of the plasma doping apparatus of FIG. 1 have been described in the first embodiment of the invention, and hence duplicated description is omitted.

In FIG. 1, a substrate 9 is placed on the sample electrode 6. In the state that the temperature of the sample electrode 6 is maintained at 10° C., helium gas is introduced into the vacuum chamber 1 at a rate of 50 sccm. In the state that the pressure of the vacuum chamber 1 is controlled at a first pressure of 3 Pa, high frequency electric power at 800 W is supplied to the coil 8 serving as a plasma source. Then, plasma is generated in the vacuum chamber 1. At one second after the generation of the plasma, in the state that the plasma is generated and that the pressure of the vacuum chamber 1 is controlled into a second pressure of 0.3 Pa lower than the first pressure (3 Pa), diborane gas ($B_2H_6$) serving as a doping material gas is introduced at a rate of 3 sccm. Once the plasma becomes stable, high frequency electric power at 200 W is supplied to the sample electrode 6 for 7 seconds. As a result of this process, boron has been doped in the vicinity of the surface of the substrate 9. A doping density is $2.3 \times 10^{13}$ atm/$cm^2$.

As described above, in the step of generating the plasma, a gas not containing the doping material gas is used. This reduces adverse influence to the sample during the generation step. The plasma mainly composed of helium is used, which gives a slight ion irradiation damage to the sample. Thereby, a low density doping can be stably carried out.

In the step of generating the plasma in the fourth embodiment, the second pressure is preferably identical to the first pressure. In this case, adverse influence to the sample is reduced during the generation step.

In the step of generating the plasma, preferably, an inert gas other than helium is supplied. An inert gas other than helium has a low limit pressure for plasma generation is lower than in helium. Thus, the plasma generation can be performed advantageously at a lower pressure.

In the step of generating the plasma, it is preferable that the high frequency electric power supplied to the plasma source is reduced. Thereby, there is an advantage that adverse influence to the sample during the generation step is reduced.

In the above-mentioned first to fourth embodiments of the invention, the implementation of the invention is not limited to the use of the apparatus shown in FIG. 1. FIG. 1 shows merely one of variations in the shape of the vacuum chamber, the scheme of the plasma source, and overall layout. The plasma doping method according to the invention is obviously applicable to various apparatuses other than that illustrated in FIG. 1.

Figure 2:
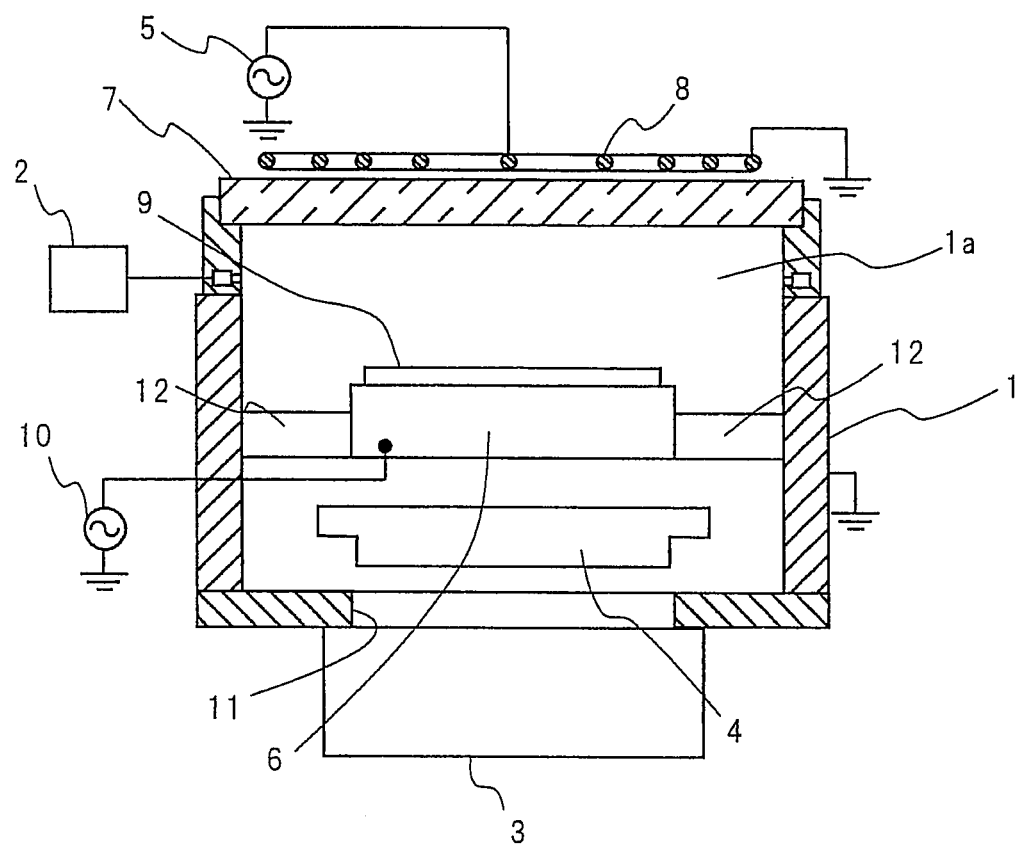
FIG. 2 is a cross sectional view of another example of a plasma doping apparatus for implementing a plasma doping method according to first through fourth embodiments of the invention.

For example, the plasma doping method according to the present invention is applicable to the apparatuses of FIG. 2 where the coil 8 has the shape of a planar spiral.

Figure 3:
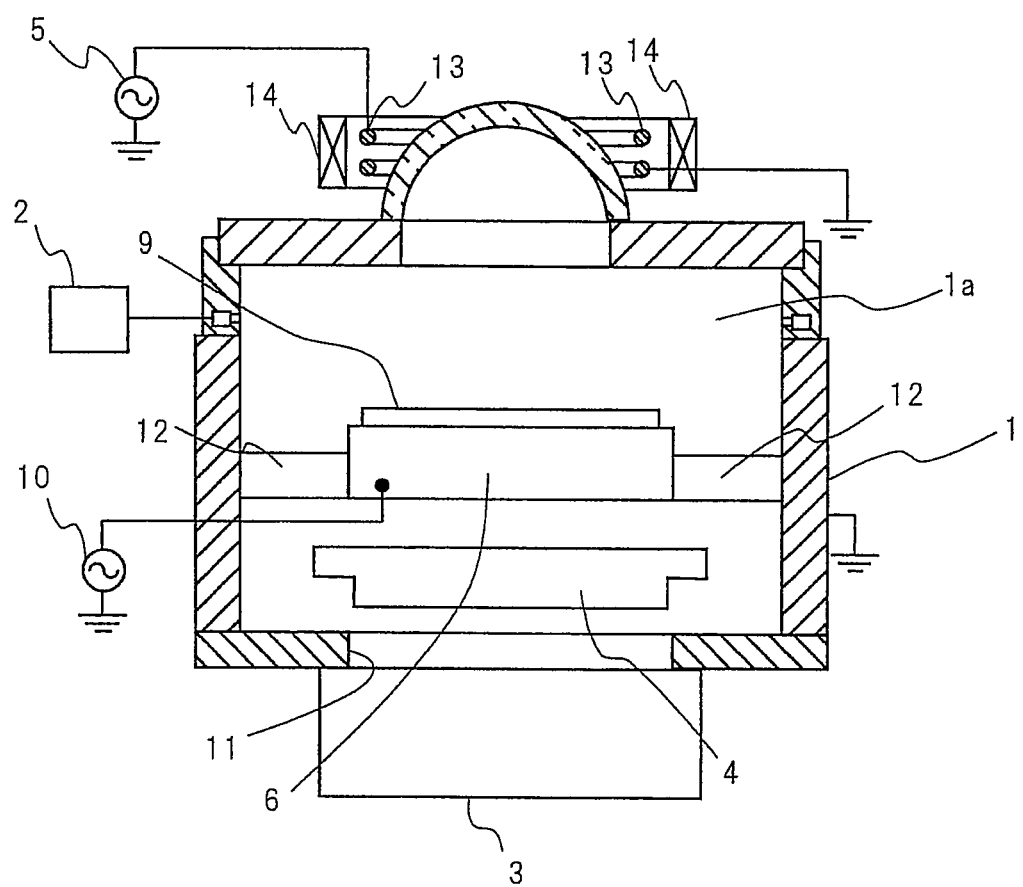
FIG. 3 is a cross sectional view of another example of a plasma doping apparatus for implementing a plasma doping method according to first through fourth embodiments of the invention.

Further, the plasma doping method according to the invention is applicable to the apparatuses of FIG. 3 where an antenna 13 is used in place of the coil 8 and where an electric magnet 14 is used as a magnetic-field generating apparatus. In this case, helicon wave plasma is generated in the vacuum chamber 1. The helicon wave plasma has a high density rather than the inductively coupled plasma. It is preferable that a DC magnetic field or a low frequency magnetic field of 1 kHz or lower is generated in the vacuum chamber 1 by adjusting the electric current following through the electric magnet 14.

Figure 4:
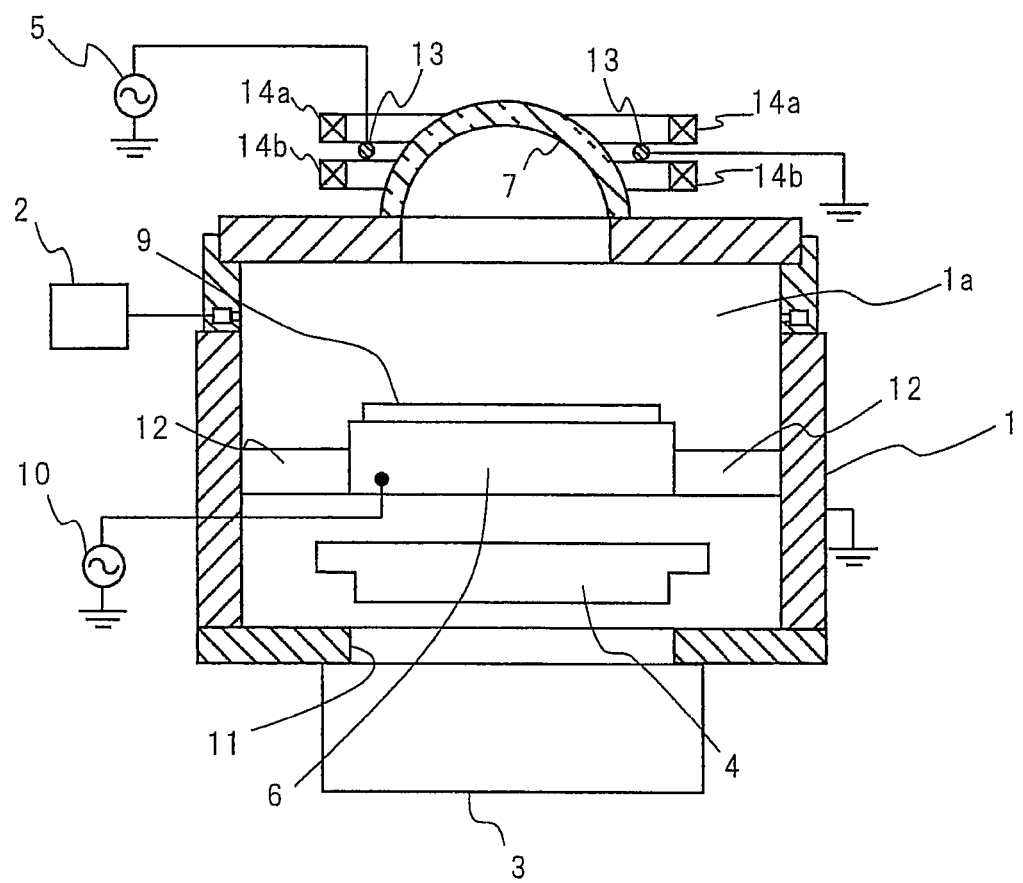
FIG. 4 is a cross sectional view of another example of a plasma doping apparatus for implementing a plasma doping method according to first through fourth embodiments of the invention.

The plasma doping method according to the present invention is applicable to the apparatuses shown in FIG. 4 of which an antenna 13 is used in place of the coil 8 and two electric magnets 14*a* and 14*b* are used as magnetic-field generating apparatuses. In this case, by flowing electric currents in the opposite directions to each other the two electric magnets 14*a* and 14*b*, magnetically neutral loop discharge plasma can be generated in the vacuum chamber 1. The magnetically neutral loop discharge plasma is generated at a higher density than the inductively coupled plasma. By adjusting the electric currents following through the electric magnets 14*a* and 14*b*, a DC magnetic field or a low frequency magnetic field of 1 kHz or lower may be applied into the vacuum chamber 1.

Figure 5:
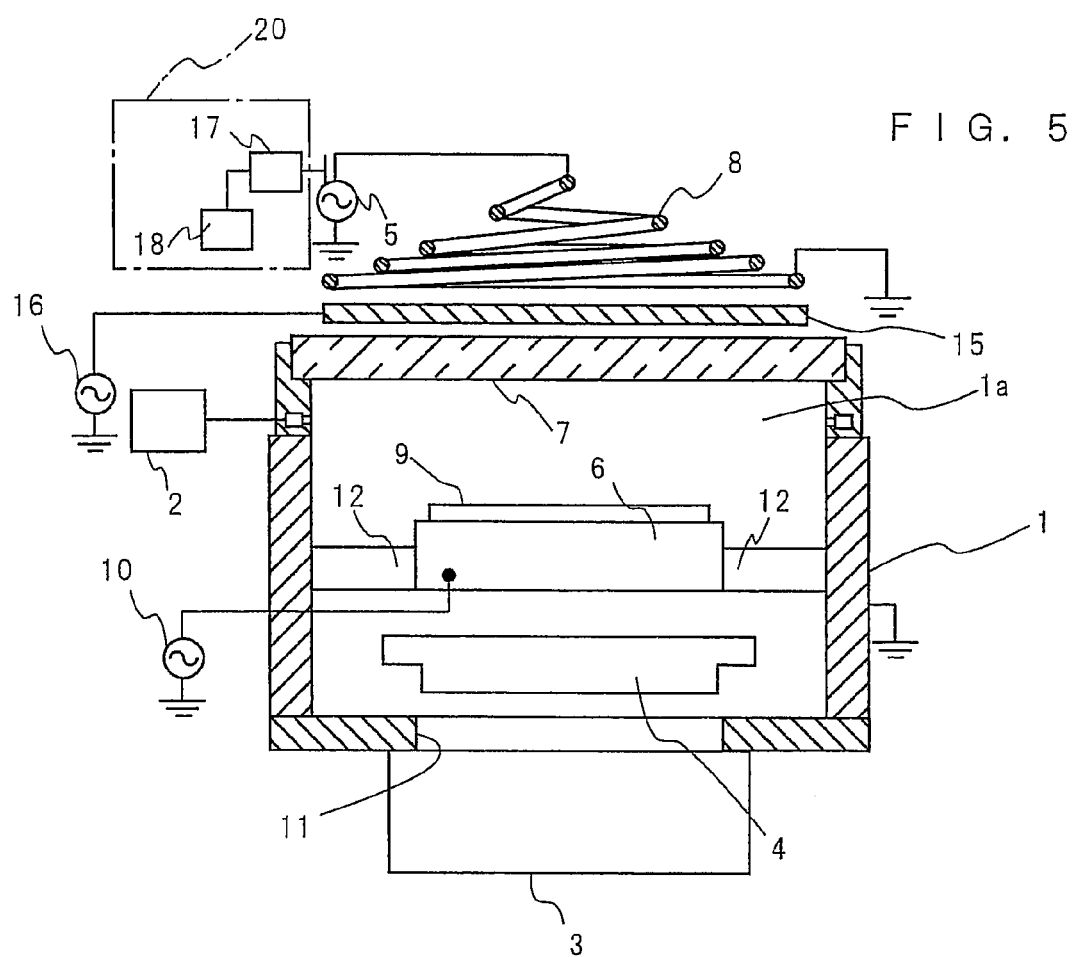
FIG. 5 is a cross sectional view of another example of a plasma doping apparatus for implementing a plasma doping method according to first through fourth embodiments of the invention.

FIG. 5 is a cross sectional view of another example of a plasma doping apparatus. In FIG. 5, a predetermined gas is continuously introduced from a gas supplying apparatus 2 into a vacuum chamber 1, while the vacuum chamber 1 is evacuated by a turbo molecular pump 3 serving as an evacuating apparatus. In the state that the pressure of the vacuum chamber 1 is maintained at a predetermined value by means of a regulating valve 4, high frequency electric power of 13.56 MHz is supplied from a high frequency power supply 5 to a coil 8 provided in the vicinity of a dielectric window 7 opposing to a sample electrode 6. According to this configuration, inductively coupled plasma is generated in the vacuum chamber 1, so that plasma doping is performed on a silicon substrate 9 serving as a sample placed on the sample electrode 6. A high frequency power supply 10 is provided for supplying high frequency electric power to the sample electrode 6. Thus, the high frequency power supply 10 can control the electric potential of the sample electrode 6 such that the substrate 9 has a negative potential relative to the plasma. The turbo molecular pump 3 and an evacuation opening 11 are arranged immediately under the sample electrode 6. The regulating valve 4 is arranged also immediately under the sample electrode 6 but immediately over the turbo molecular pump 3, and serves as a valve for increasing and reducing the pressure. The sample electrode 6 is mounted in the vacuum chamber 1 by four supporting members 12. The dielectric window 7 is composed mainly of quartz glass, and contains boron as impurities.

A high frequency power supply 16 is provided to supply a high frequency electric power of 500 kHz to a bias electrode 15 provided between the coil 8 and the dielectric window 7. The bias electrode 15 is composed of a large number of strip-shaped electrodes arranged in a radial manner as known in the art. The longitudinal direction of each strip-shaped electrode is arranged perpendicular to the conductor of the spiral coil 8. This arrangement of the bias electrode 15 allows the high frequency electromagnetic field emitted from the coil 8 to enter almost completely into the vacuum chamber 1. The bias electrode 15 covers almost entire area of the dielectric window 7, so as to control the amount of boron sputtered from the boron-containing quartz glass of the dielectric window 7 into the plasma. In the output of the high frequency power supply 5, provided is a reflection wave detecting circuit 20 comprising a band pass filter 17 and a reflection wave meter 18. The band pass filter 17 is provided as a circuit to eliminate the modulation caused by the high frequency electric power of 500 kHz from the high frequency power supply 16 in the detection of the reflection wave of the high frequency electric power of 13.56 MHz supplied from the high frequency power supply 5. The band pass filter 17 also eliminates the influence of which the plasma sheath thickness in the surface of the dielectric window 7 varies at 500 KHz of frequency by supplying the high frequency electric power of 500 kHz. The band pass filter 17 extracts solely the 13.56-MHz component from the reflection wave of the high frequency electric power of 13.56 MHz, so as to transmit the component to the reflection wave meter 18. In this configuration, the processing is performed in the state that the reflection wave of the high frequency electric power of 13.56 MHz is monitored by the reflection wave meter 18. This permits real-time detection of troubles in the matching state and in the 13.56-MHz high frequency power supply.

This configuration permits such doping processing that no doping material gas is introduced into the vacuum chamber 1, and impurities can be doped into a sample or into a film on the surface of the sample by the doping material generated from the dielectric window 7 containing necessary impurities in the state of solid.

In the above-mentioned embodiments of the invention, in order that the generation and the low density doping are ensured under a condition that the second pressure is lower than the first pressure, the first pressure is preferably 1 Pa through 10 Pa, while the second pressure is preferably 0.01 Pa through 1 Pa. More preferably, the first pressure is 2 Pa through 5 Pa, while the second pressure is 0.01 Pa through 0.5 Pa.

In the case that an inert gas other than helium is used, preferable is the use of at least one selected from the group consisting of neon, argon, krypton, and xenon. These inert gases cause only smaller adverse influence to the sample than other kinds of gases.

In the case that the high frequency electric power supplied to the plasma source is reduced in the generation step, it is preferred that the low density doping is achieved under the condition that the generation is ensured and that adverse influence to the sample is suppressed during the generation step. For this purpose, the high frequency electric power supplied to the plasma source in the generation step is preferably {fraction ($1/100$)} through $1/2$ of that in the doping step. More preferably, the high frequency electric power supplied to the plasma source in the generation step is {fraction ($1/20$)} through $1/5$ of the high frequency electric power supplied to the plasma source in the doping step.

In the case that a doping material gas is introduced into the vacuum chamber, for the purpose of achieving low density doping, the partial pressure of the doping material gas is preferably {fraction ($1/1,000$)} through $1/5$ of the pressure of the vacuum chamber in the doping step. Moreover, the partial pressure of the doping material gas is preferably {fraction ($1/100$)} through {fraction ($1/10$)} of the pressure of the vacuum chamber in the doping step.

The above-mentioned embodiments have been described for the case that the sample is a semiconductor substrate composed of silicon. However, the plasma doping method according to the invention is applicable also to the processing of samples composed of other various kinds of substances.

The above-mentioned embodiments have been described for the case that the impurities are composed of boron. However, in the case that the sample is a semiconductor substrate composed of silicon, the plasma doping method according to the invention is effective especially for the case that the impurities are arsenic, phosphorus, boron, aluminum and antimony. This is because these impurities can form a shallow junction in the transistor section.

The plasma doping method according to the invention is effective especially for the case of a low doping density. Specifically, the method is effective as a plasma doping method aiming at a doping density of $1\times10^{11}$ atm/cm$^2$ through $1\times10^{17}$ atm/cm$^2$. The method is more effective as a plasma doping method aiming at a doping density of $1\times10^{11}$ atm/cm$^2$ through $1\times10^{14}$ atm/cm$^2$.

The method according to the invention is effective also in the case that electron cyclotron resonance (ECR) plasma is used. However, the method is effective especially in the case of plasma other than the ECR plasma. The ECR plasma has the advantage that the plasma generation is easy even at low pressures. Nevertheless, apparatuses using the ECR plasma have a strong DC magnetic field in the vicinity of the sample. Therefore, charge separation of electrons and ions is liable to occur, and hence it has a disadvantage which is inferior in uniformity of a doping amount. The low density doping which is excellent in uniformity can be realized by applying the present invention to a plasma doping method using other high density plasma source without using the ECR plasma.

Fifth Embodiment

A plasma doping method according to a fifth embodiment of the present invention is described below with reference to FIG. 6 through FIG. 8.

Figure 6:
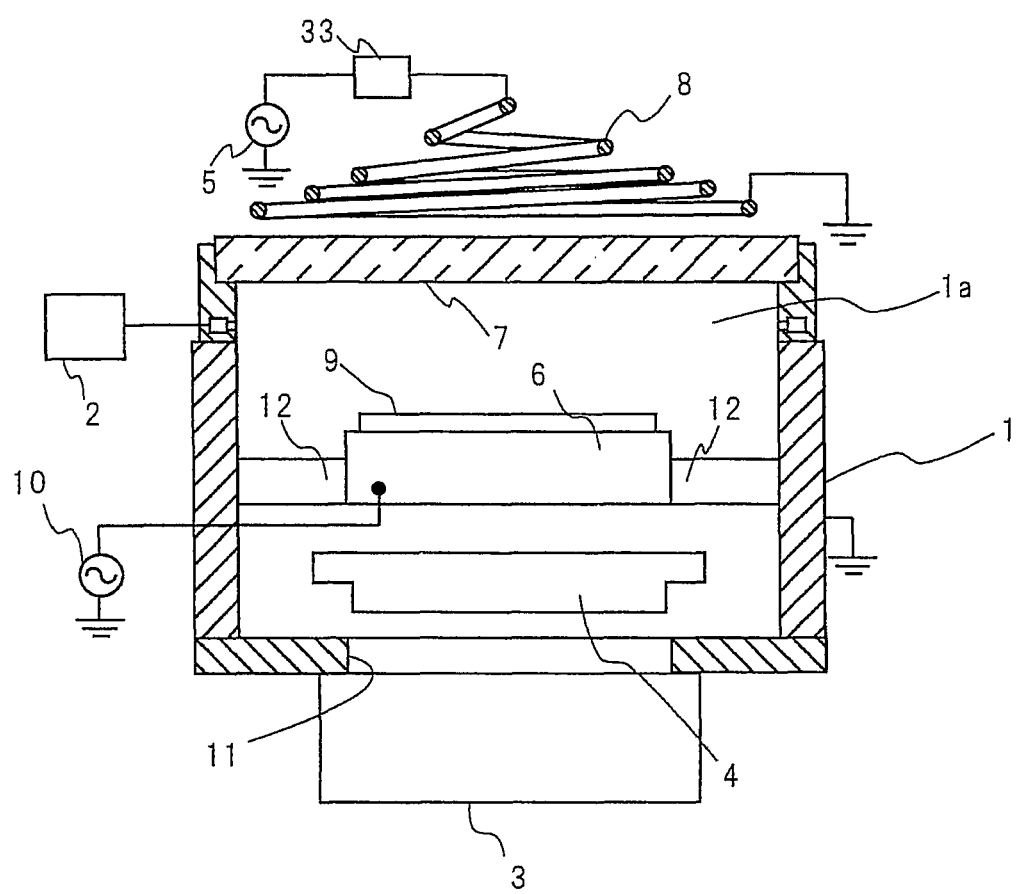
FIG. 6 is a cross sectional view of a plasma doping apparatus for implementing a plasma doping method according to a fifth embodiment of the invention.

FIG. 6 is a cross sectional view of a plasma doping apparatus for implementing the plasma doping method according to the fifth embodiments of the invention. In FIG. 6, a silicon substrate 9 as a sample is placed on the sample electrode 6 provided in a vacuum chamber 1. A predetermined gas is continuously introduced from a gas supplying apparatus 2 into the vacuum chamber 1, while the vacuum chamber 1 is evacuated by a turbo molecular pump 3 serving as an evacuating apparatus. In the state that the pressure of the vacuum chamber 1 is maintained at a predetermined value by means of a regulating valve 4, a high frequency electric power of 13.56 MHz is supplied from a high frequency power supply 5 to a coil 8 serving as a plasma generating apparatus provided in the vicinity of a dielectric window 7 opposing to a sample electrode 6. According to this configuration, inductively coupled plasma is generated in the vacuum chamber 1, so that plasma doping is performed on a silicon substrate 9 placed on the sample electrode 6. A high frequency power supply 10 is provided for supplying high frequency electric power to the sample electrode 6. Thus, the high frequency power supply 10 can control the electric potential of the sample electrode 6 such that the silicon substrate 9 has a negative potential relative to the plasma. The turbo molecular pump 3 and an evacuation opening 11 are arranged immediately under the sample electrode 6. The regulating valve 4 is arranged also immediately under the sample electrode 6 but immediately over the turbo molecular pump 3, and serves as a valve for increasing and reducing the pressure. The sample electrode 6 is mounted in the vacuum chamber 1 by four supporting members 12. The dielectric window 7 is composed mainly of quartz glass. A matching circuit 33 for plasma generating apparatus is provided between the high frequency power supply 5 and the coil 8.

Figure 7:
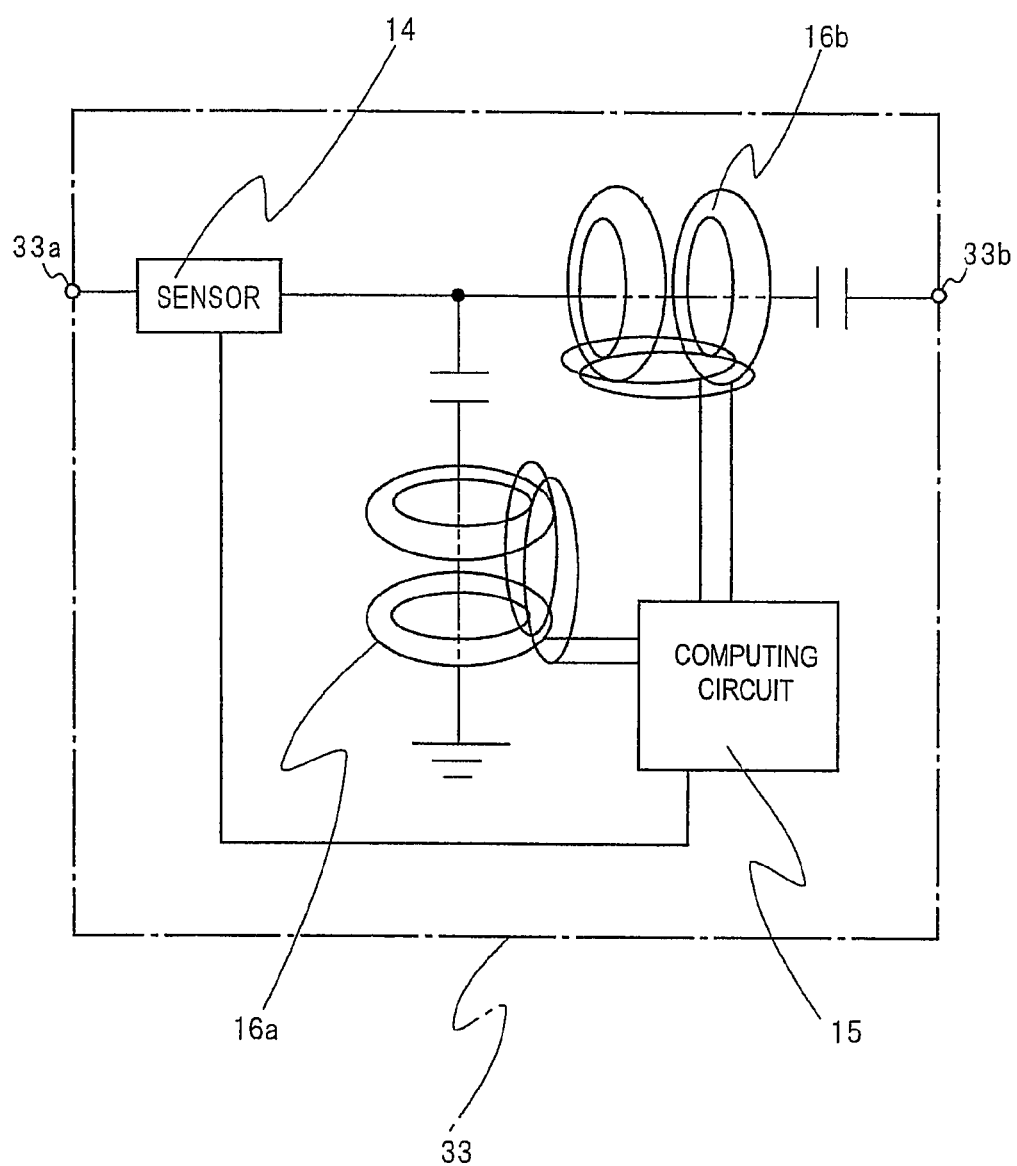
FIG. 7 is a circuit diagram of a matching circuit for plasma generating apparatus used in the fifth embodiment of the invention.
Figure 8:
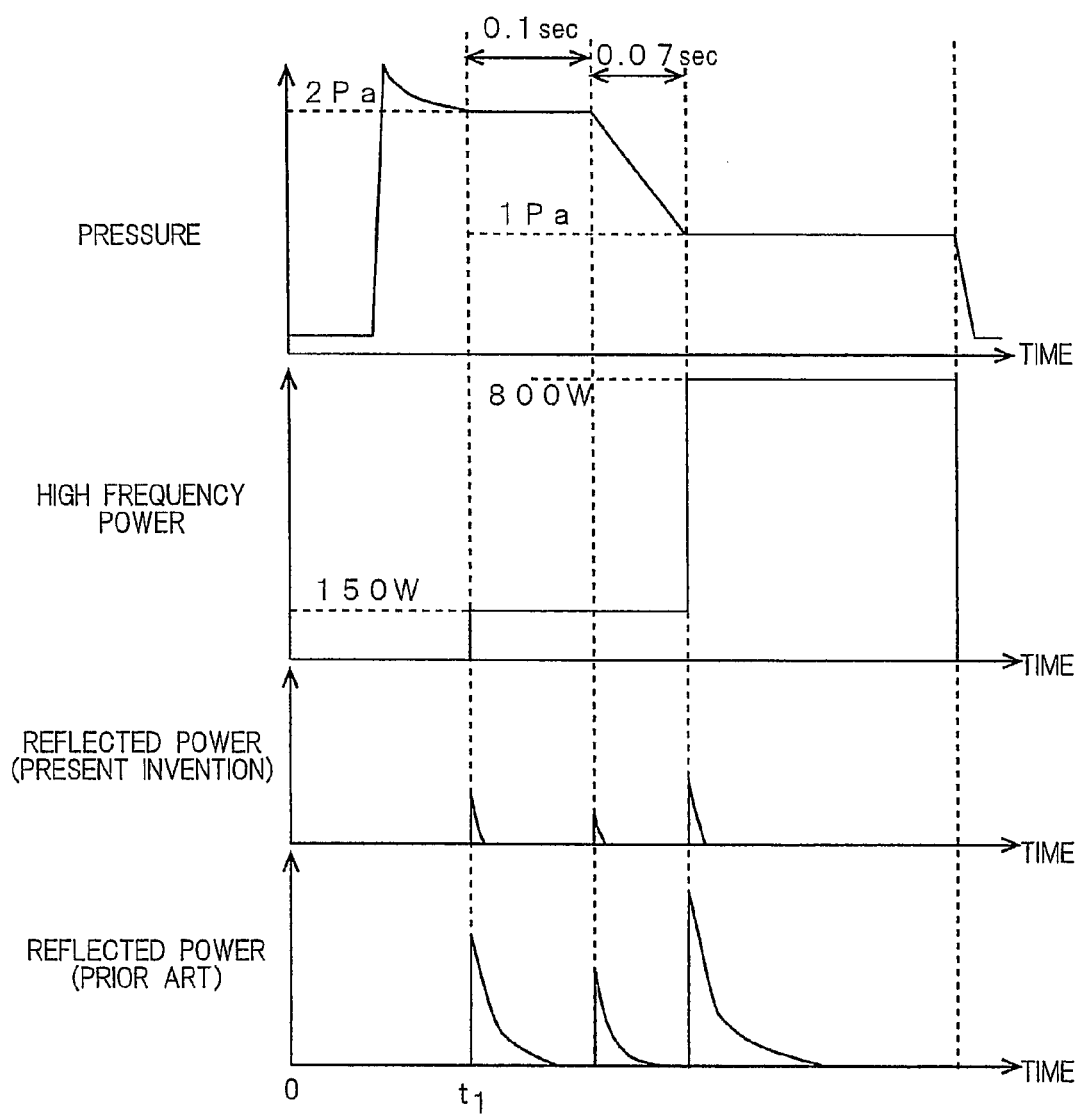
FIG. 8 is a timing chart showing the operation according to the fifth embodiment of the invention.

The matching circuit 33 for the plasma generating apparatus is marked and is known in the art, and is described simply with reference to the block diagram of FIG. 7. In FIG. 7, the output terminal 33b in FIG. 7 is connected to the coil 8 in FIG. 6. When high frequency electric power is supplied from the high frequency power supply 5 to the input terminal 33a of the matching circuit 33, in response to a signal from a sensor 14, a computing circuit 15 outputs control signals to toroidal cores 16a and 16b. Consequently, the permeabilities of the toroidal cores 16a and 16b are changed, and thus the high frequency inductances change. Thereby, the matching circuit 33 is adjusted to a desired matching state. The matching circuit 33 for plasma generating apparatus uses the toroidal cores 16a and 16b which have no mechanically moving section and which can adjust the impedance in response merely to an electric signal. Thus, the time necessary for the matching is 1 milliseconds or shorter.

A silicon substrate 9 is placed on the sample electrode 6. In the state that the temperature of the sample electrode 6 is maintained at 10° C., helium gas is introduced into the vacuum chamber 1 at a rate of 50 sccm, and diborane gas ($B_2H_6$) serving as a doping material gas is also introduced at the rate of 3 sccm. In the state that the pressure of the vacuum chamber 1 is controlled at a first pressure of 2 Pa, high frequency electric power at 150 W is supplied to the coil 8 serving as a plasma source. Then, plasma is generated in the vacuum chamber 1.

The process according to the present embodiment is described below with reference to the timing chart of FIG. 8. The supply of the high frequency electric power at 150 W to the coil 8 is started at time $t_1$. At 0.1 seconds after the start of the supply of the high frequency electric power, in the state that the plasma is generated, the pressure of the vacuum chamber 1 is controlled into a second pressure of 1 Pa lower than the first pressure (2 Pa) by adjusting the regulating valve 4.

Then, at 0.07 seconds after, the high frequency electric power supplied to the coil 8 is increased into 800 W, while high frequency electric power at 200 W is supplied to the sample electrode 6. As a result of this process, boron has been doped in the vicinity of the surface of the substrate 9. When this process was repeated successively for 100 times, the mean of doping density was $2.5 \times 10^{13}$ atm/cm$^2$, while the variation was +1.4%.

For comparison, similar process was performed using a prior art matching circuit using variable capacitors. In this process, a large reflection wave was produced at the timing of the change of the control parameters, that is, pressure and high frequency electric power. Further, the magnitude of this reflection wave varied in each of the repeated processes. As a result, when the process was repeated successively for 100 times, the mean of doping density was $2.4 \times 10^{13}$ atm/cm$^2$, and the variation was as large as ±2.8%. FIG. 8 shows the waveforms of the reflection waves in the present embodiment and in the prior art.

As described above, by performing plasma generation at a pressure higher than in the doping step, stable plasma generation is realizable. Therefore, a low density doping can be stably carried out by using plasma composed mainly of helium causing only a reduced amount of ion irradiation damage to the sample. This permits stable low density doping. Further, in the step of generating the plasma, the high frequency electric power supplied to the plasma source is reduced. Thereby adverse influence to the sample during the generation step can be reduced. Furthermore, in the present embodiment, the matching circuit 33 for plasma generating apparatus is used, which comprises the toroidal cores 16a and 16b serving as two variable impedance elements without any mechanically moving section. Therefore, no large reflection wave occurs even when the control parameters are changed. This permits excellently reproducible processing.

In the fifth embodiment, in the step of generating the plasma, an inert gas other than helium may be supplied. In an inert gas other than helium, the low limit of pressure for generation is lower than in helium. Thus, the plasma generation can be performed advantageously at a lower pressure.

In the step of generating the plasma, the supply of the doping material gas into the vacuum chamber 1 may be stopped. In this case also, there is an advantage that adverse influence to the sample during the generation step can be reduced.

Sixth Embodiment

Figure 9:
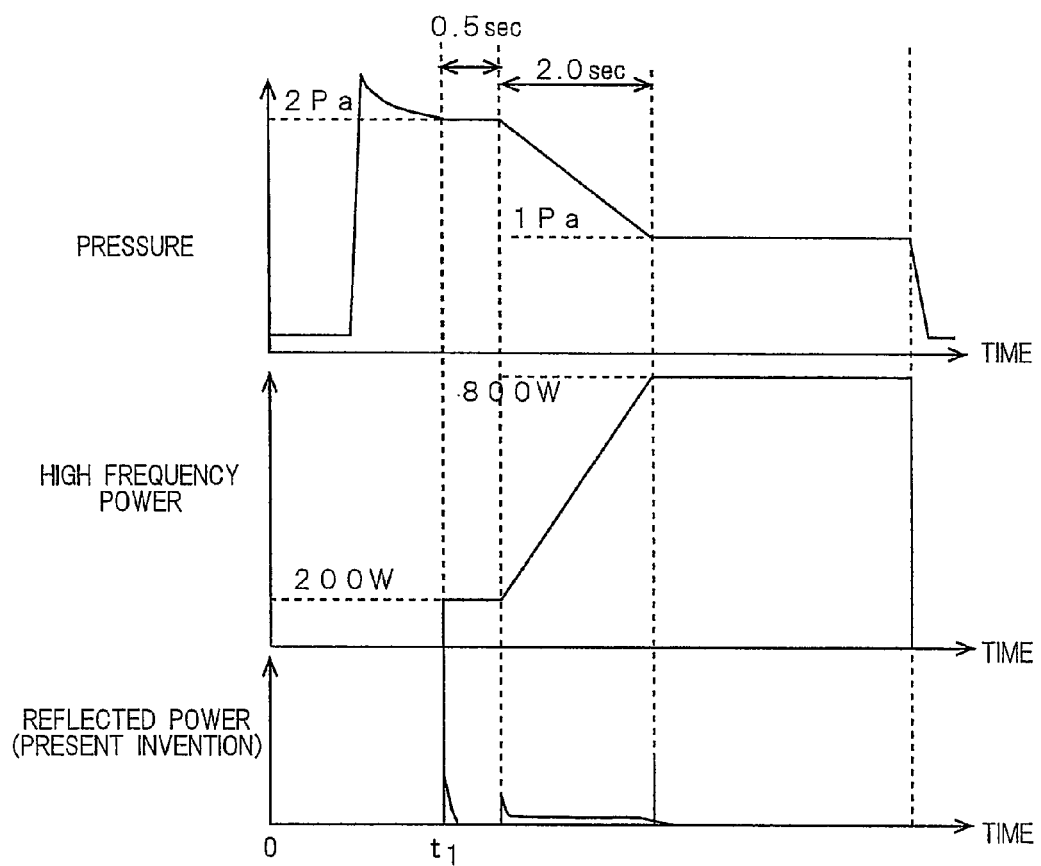
FIG. 9 is a timing chart showing the operation according to a sixth embodiment of the invention.

A plasma doping method according to a sixth embodiment of the present invention is described below with reference to FIG. 9.

A plasma doping apparatus for implementing the plasma doping method according to the sixth embodiment have a configuration similar to that shown in FIG. 6 and FIG. 7, and hence duplicated description is omitted.

A substrate 9 is placed on the sample electrode 6. In the state that the temperature of the sample electrode 6 is maintained at 10° C., helium gas is introduced into the vacuum chamber 1 at a rate of 50 sccm, and also diborane gas ($B_2H_6$) serving as a doping material gas is introduced at the rate of 3 sccm. In the state that the pressure of the vacuum chamber 1 is controlled at a first pressure of 2 Pa, high frequency electric power at 200 W is supplied to the coil 8 serving as a plasma source. Then, plasma is generated in the vacuum chamber 1.

The process according to the present embodiment is described below with reference to the timing chart of FIG. 9. The supply of the high frequency electric power at 200 W to the coil 8 is started at time $t_1$. At 0.5 seconds after the start of the supply of the high frequency electric power, in the state that the plasma is generated, the pressure of the vacuum chamber 1 is controlled into a second pressure of 1 Pa lower than the first pressure (2 Pa) by gradually increasing the openness of the regulating valve 4. At the same time, the high frequency electric power supplied to the coil 8 was increased into 800 W gradually in 2.0 seconds. The pressure and the high frequency electric power as control parameters are changed gradually in 2.0 seconds. After that, high frequency electric power at 200 W is supplied to the sample electrode 6. As a result of this process, boron can be doped in the vicinity of the surface of the substrate 9. When this process was repeated successively for 100 times, the mean of doping density was $2.5 \times 10^{13}$ atm/cm$^2$, and the variation was ±0.9%.

As described above, plasma generation is performed at a pressure higher than in the doping step. Thereby stable plasma generation is realizable. Furthermore, stable low density doping can be carried out by using the plasma composed of mainly helium causing only a reduced amount of ion irradiation damage to the sample. Further, in the step of generating the plasma, the high frequency electric power supplied to the plasma source is reduced. Thereby, adverse influence to the sample during the generation step is reduced. Furthermore, in the present embodiment, the matching circuit 33 for plasma generating apparatus is used, which comprises the toroidal cores 16a and 16b serving as two variable impedance elements without any mechanically moving section. Therefore, no large reflection wave occurs even when the control parameters are changed. Excellently reproducible processing can be carried out. Further, since the control parameters are changed gradually in 2.0 seconds, the impedance change is also gradual. This reduces the reflection wave further, in comparison with the fifth embodiment shown in FIG. 8. Thus, reproducibility is improved.

In the sixth embodiment, in the step of generating the plasma, an inert gas other than helium may be supplied. In an inert gas other than helium, the low limit of pressure for generation is lower than in helium. Thus, the plasma generation can be performed advantageously at a lower pressure.

In the step of generating the plasma, the supply of the doping material gas into the vacuum chamber may be stopped. This reduces adverse influence to the sample during the generation step.

The present embodiment has been described for the case that the control parameters are changed gradually in 2 seconds. However, the control parameters are changed preferably in 1 second through 5 seconds. In the case that a matching circuit for plasma generating apparatus comprising variable capacitors is used, when the control parameters are changed in less than 1 second, a large reflection wave is liable to occur. When the control parameters are changed in greater than 5 seconds, the processing time increases so as to reduce the productivity.

The fifth and sixth embodiments of the present invention disclose merely examples of applicable forms of the plasma doping method according to the invention. The plasma doping method according to the invention is obviously applicable to apparatuses of diverse variations with respect to the shape of the vacuum chamber, the scheme of the plasma source, and overall layout.

For example, the coil 8 may have a planar shape as shown in FIG. 2. Further, helicon wave plasma and magnetically neutral loop plasma may be used.

It is possible that no doping material gas is introduced into the vacuum chamber 1, and impurities are doped into a sample or into a film on the surface of the sample by using doping material generated from an impurity material in the state of solid.

The plasma doping method according to the invention is useful especially in the case that at least one of control parameters, such as gas species, gas flow rate, pressure, and high frequency electric power, is changed in the state that the plasma is generated.

In the case that the pressure is changed from the first pressure to the second pressure in the state that the plasma is generated, it is preferable that the second pressure is lower than the first pressure. In order that the generation and the low density doping are ensured, the first pressure is preferably 1 Pa through 10 Pa, and the second pressure is preferably 0.01 Pa through 1 Pa. More preferably, the first pressure is 2 Pa through 5 Pa, and the second pressure is 0.01 Pa through 0.5 Pa.

In the case that an inert gas other than helium is used, it is preferable to use at least one selected from the group consisting of neon, argon, krypton, and xenon. These inert gases cause only smaller adverse influence to the sample than other kinds of gases.

In the case that the high frequency electric power supplied to the plasma source is reduced in the generation step, it is preferred that the low density doping is achieved under the condition that the generation is ensured and that adverse influence to the sample is suppressed during the generation step. For this purpose, the high frequency electric power supplied to the plasma source in the generation step is preferably {fraction ($1/100$)} through ½ of the high frequency electric power supplied to the plasma source in the doping step. More preferably, the high frequency electric power supplied to the plasma source in the generation step is {fraction ($1/20$)} through ⅕ of the high frequency electric power supplied to the plasma source in the doping step.

In the case that a doping material gas is introduced into the vacuum chamber, for the purpose of achieving low density doping, the partial pressure of the doping material gas is preferably {fraction ($1/1,000$)} through ⅕ of the pressure of the vacuum chamber in the doping step. More preferably, the partial pressure of the doping material gas is preferably {fraction ($1/100$)} through {fraction ($1/10$)} of the pressure of the vacuum chamber in the doping step.

The above-mentioned embodiments of the invention have been described for the case that the sample is a semiconductor substrate composed of silicon. However, the plasma doping method according to the invention is applicable also to the processing of samples composed of other various kinds of substances.

The above-mentioned embodiments of the invention have been described for the case that the impurities are composed of boron. However, in the case that the sample is a semiconductor substrate composed of silicon, the plasma doping method according to the invention is effective especially for the case that the impurities are composed of arsenic, phosphorus, boron, aluminum, and antimony. This is because these impurities can form a shallow junction in the transistor section.

The plasma doping method according to the invention is effective especially for the case of a low doping density. Specifically, the method is effective as a plasma doping method aiming at a doping density of $1\times10^{11}$ atm/cm$^2$ through $1\times10^{17}$ atm/cm$^2$. The method is more effective as a plasma doping method aiming at a doping density of $1\times10^{11}$ atm/cm$^2$ through $1\times10^{14}$ atm/cm$^2$.

The method according to the invention is also effective when electron cyclotron resonance (ECR) plasma is used. However, the method is effective especially in the case of plasma other than the ECR plasma. The ECR plasma has the advantage that the plasma generation is easy even at low pressures. Nevertheless, apparatuses using ECR plasma have a strong DC magnetic field in the vicinity of the sample. Therefore, the charge separation of electrons and ions is liable to occur, and hence it has a disadvantage which is inferior in uniformity of a doping amount. The low density doping which is excellent in uniformity can be realized by applying the present invention to a plasma doping method using other high density plasma source without using the ECR plasma.

Seventh Embodiment

Figure 11:
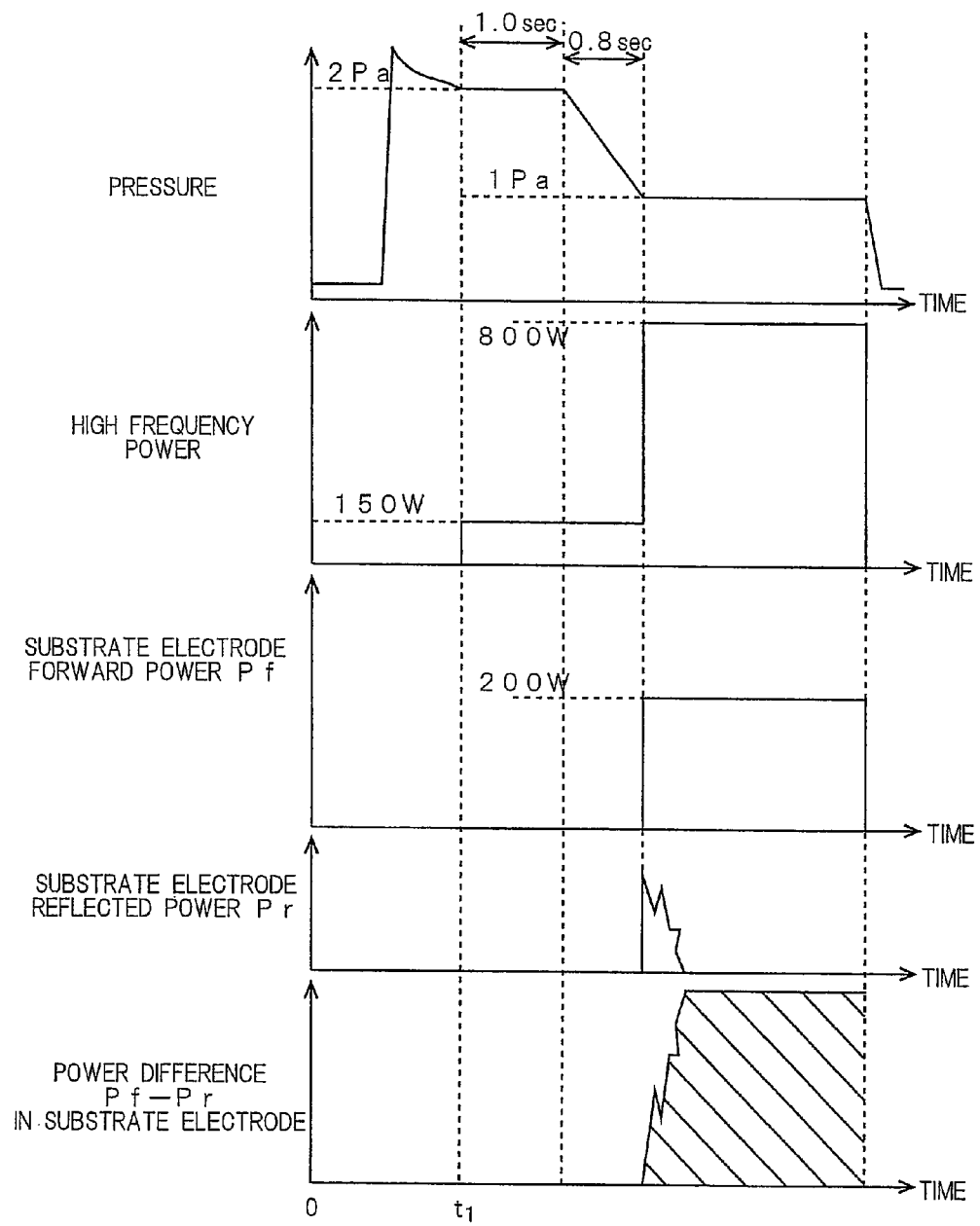
FIG. 11 is a timing chart showing the operation according to the seventh embodiment of the invention.
Figure 12:
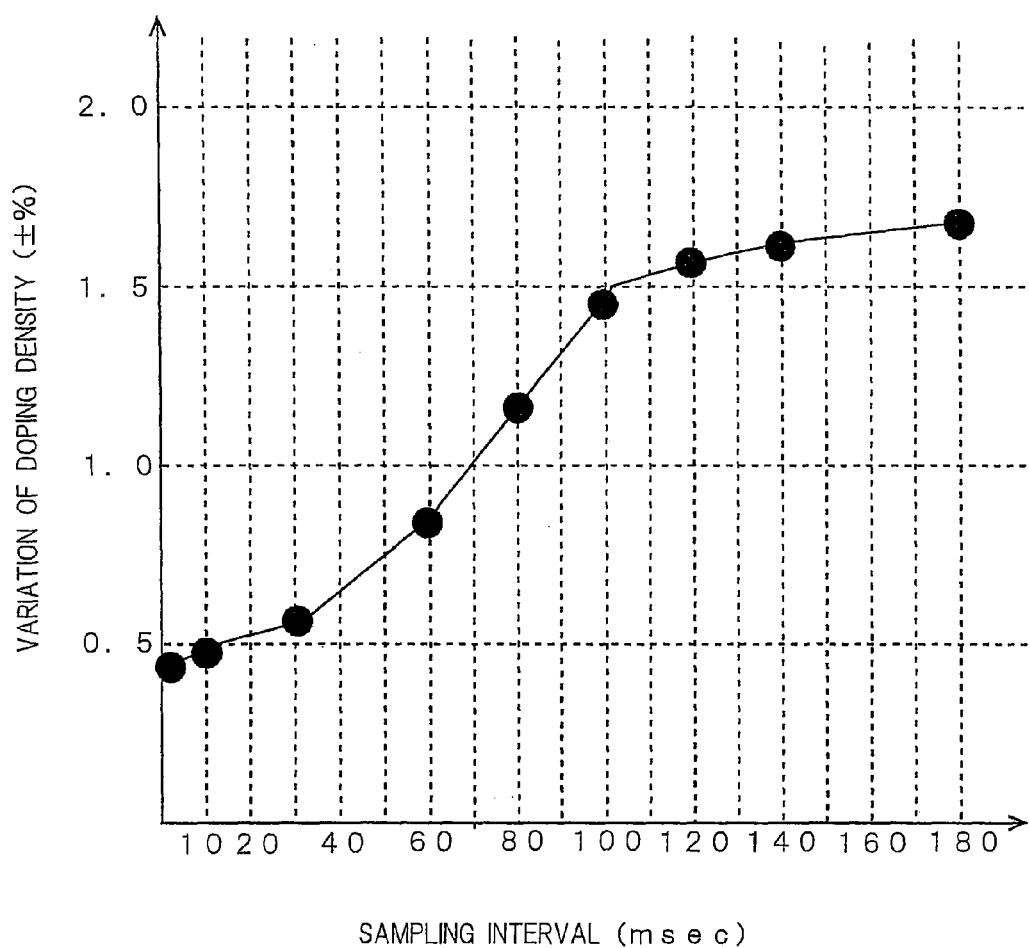
FIG. 12 is a graph showing the relation of sampling interval with variation in doping density according to the seventh embodiment of the invention.

A plasma doping method according to a seventh embodiment of the present invention is described below with reference to FIG. 10 through FIG. 12.

Figure 10:
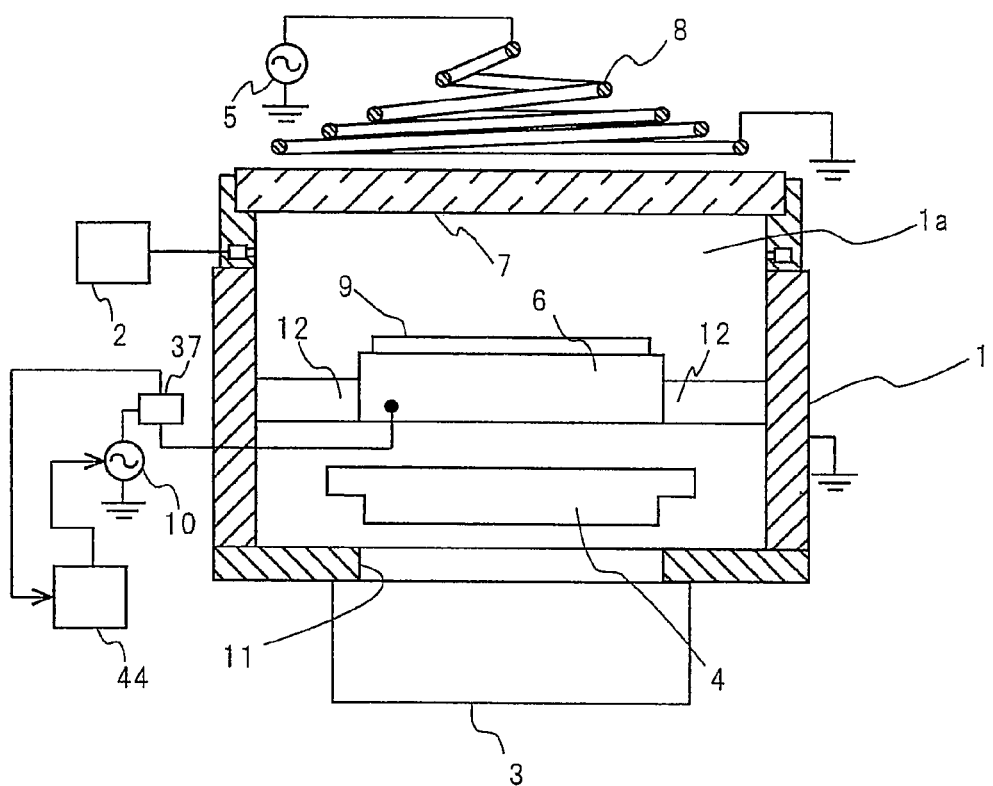
FIG. 10 is a cross sectional view of a plasma doping apparatus for implementing a plasma doping method according to a seventh embodiments of the invention.

FIG. 10 is a cross sectional view of a plasma doping apparatus for implementing a plasma doping method according to the seventh embodiments of the invention. In the plasma doping apparatus of FIG. 10, the output of a high frequency power supply 10 is supplied through a sampler 37 to a sample electrode 6. The sampler 37 provides a control signal to a control apparatus 44. The output of the control apparatus 44 is provided to the high frequency power supply 10 so as to control this high frequency power supply. A predetermined gas is continuously introduced from a gas supplying apparatus 2 into a vacuum chamber 1, while the vacuum chamber 1 is evacuated by a turbo molecular pump 3 serving as an evacuating apparatus. In the state that the pressure of the vacuum chamber 1 is maintained at a predetermined value by means of a regulating valve 4, a high frequency electric power of 13.56 MHz is supplied from a high frequency power supply 5 to a coil 8 serving as a plasma generating apparatus provided in the vicinity of a dielectric window 7 opposing to a sample electrode 6. According to this configuration, inductively coupled plasma is generated in the vacuum chamber 1, so that plasma doping is performed on a silicon substrate 9 serving as a sample placed on the sample electrode 6.

A high frequency power supply 10 is provided for supplying high frequency electric power to the sample electrode 6. Thus, the high frequency power supply 10 can control the electric potential of the sample electrode 6 such that the silicon substrate 9 has a negative potential relative to the plasma. The turbo molecular pump 3 and an evacuation opening 11 are arranged immediately under the sample electrode 6. The regulating valve 4 is arranged also immediately under the sample electrode 6 but immediately over the turbo molecular pump 3, and serves as a valve for increasing and reducing the pressure. The sample electrode 6 is mounted in the vacuum chamber 1 by four supporting members 12. The dielectric window 7 is composed mainly of quartz glass.

When the forward power of the high frequency electric power supplied to the sample electrode 6 is denoted by Pf and the reflected power thereof is denoted by Pr, the sampler 37 samples the power difference Pf-Pr which is the difference of the forward power Pf and the reflected power Pr in every interval of 1 millisecond through 100 milliseconds. When the integration of the power difference Pf-Pr with respect to time reaches a predetermined value, the controlling apparatus 44 stops the supply of the high frequency electric power.

A substrate 9 is placed on the sample electrode 6. In the state that the temperature of the sample electrode 6 is maintained at 10° C., helium gas is introduced into the vacuum chamber 1 at the rate of 50 sccm, and also diborane gas ($B_2H_6$) serving as a doping material gas is introduced at the rate of 3 sccm. In the state that the pressure of the vacuum chamber 1 is controlled at a first pressure of 2 Pa, high frequency electric power at 150 W is supplied to the coil 8 serving as a plasma source. Then, plasma is generated in the vacuum chamber 1. The process according to the present embodiment is described below with reference to the timing chart of FIG. 11.

The supply of the high frequency electric power to the coil 8 is started at time $t_1$. At one second after the start of the supply of the high frequency electric power, in the state that the plasma is generated, the pressure of the vacuum chamber 1 is controlled into a second pressure of 1 Pa lower than the first pressure (2 Pa) by adjusting the regulating valve 4. Then, at 0.8 seconds after the start of control of the regulating valve 4, the high frequency electric power supplied to the coil is increased into 800 W, while high frequency electric power at 200 W is supplied to the sample electrode 6. As a result of this process, boron has been doped in the vicinity of the surface of the substrate 9. When the forward power of the high frequency electric power supplied to the sample electrode 6 is denoted by Pf and the reflected power thereof is denoted by Pr, the sampler 37 samples the power difference Pf-Pr in every interval of 80 milliseconds. When the integration of the sampled power difference Pf-Pr with respect to time reaches a predetermined value, the controlling apparatus 44 stops the supply of the high frequency electric power. That is, when the area of the shaded region in the graph in the bottom of FIG. 11 reaches 1400 W second, the supply of the high frequency electric power to the plasma generating apparatus 8 and the sample electrode 6 is stopped.

When this process was repeated successively for 100 times, the mean of doping density was $3.5 \times 10^{13}$ atm/cm$^2$, while the variation was ±1.2%.

Further, the variation of doping density was measured with changing the sampling interval for the power difference Pf-Pr. FIG. 12 is a graph showing the variation of doping density when the process was repeated successively for 100 times for each value of the sampling interval. For the sampling interval of 100 milliseconds or less, the variation decreases rapidly into a value less than ±1.5%. For much smaller sampling interval of 10 milliseconds or less, the variation decreases as small as a value less than ±0.5%.

The reason of this excellent reproducibility in the processing is that the present method utilizes the fact that the doping density is proportional to both the high frequency electric power supplied to the sample electrode 6 and the processing time under the condition of the same gas species, the same gas flow rate, and the same gas pressure. When the integration of the power difference Pf-Pr with respect to time reaches a predetermined value, the doping density also reaches a predetermined value. Accordingly, by stopping the supply of the high frequency electric power at that time, the doping density is adjusted into the predetermined value. Even in the case that variation occurs in the generation of the reflection wave, the effective electric power supplied to the sample electrode 6 is detected by sampling the power difference Pf-Pr. Therefore, exact doping density is known from the integration of the sampled power difference Pf-Pr with respect to time.

The present embodiment has been described for the case that when the forward power of the high frequency electric power supplied to the sample electrode 6 is denoted by Pf and when the reflected power thereof is denoted by Pr, the power difference Pf-Pr is sampled. Another implementation is also possible such that when the forward power of the high frequency electric power supplied to the coil 8 serving as the plasma generating apparatus is denoted by Pf and when the reflected power thereof is denoted by Pr, the power difference Pf-Pr is sampled. An exemplary configuration of a plasma doping apparatus in this case is shown in FIG. 13.

Figure 13:
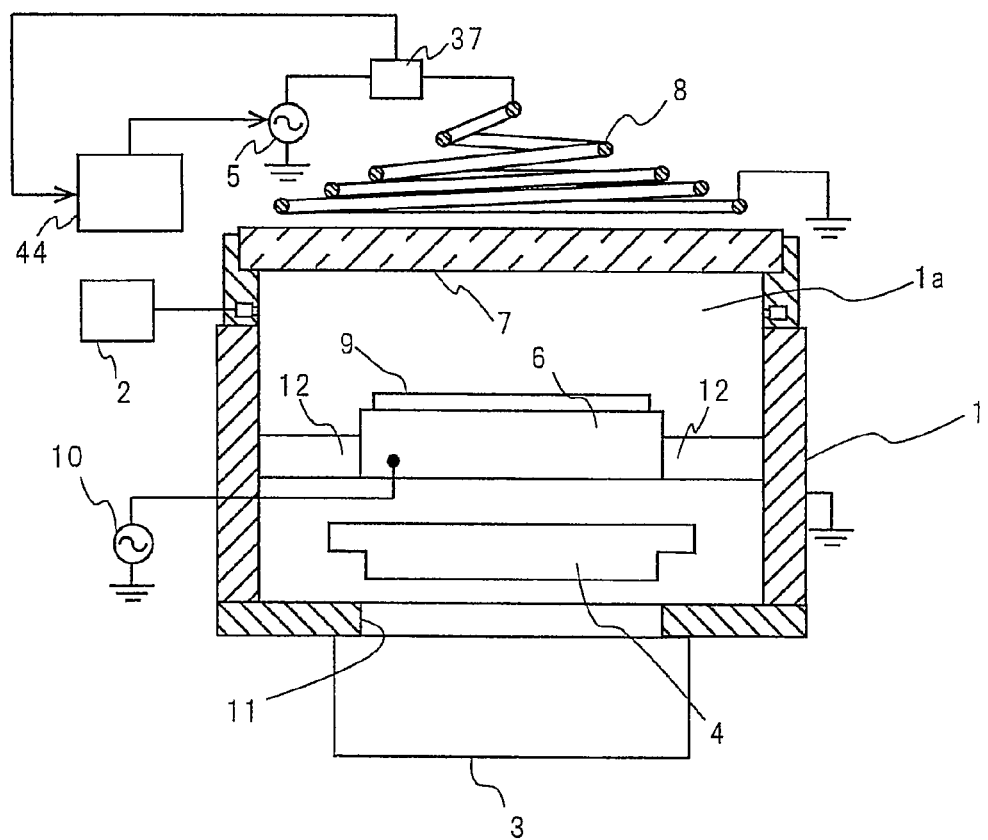
FIG. 13 is a cross sectional view of another example of a plasma doping apparatus for implementing a plasma doping method according to the seventh embodiments of the invention.
Figure 1:
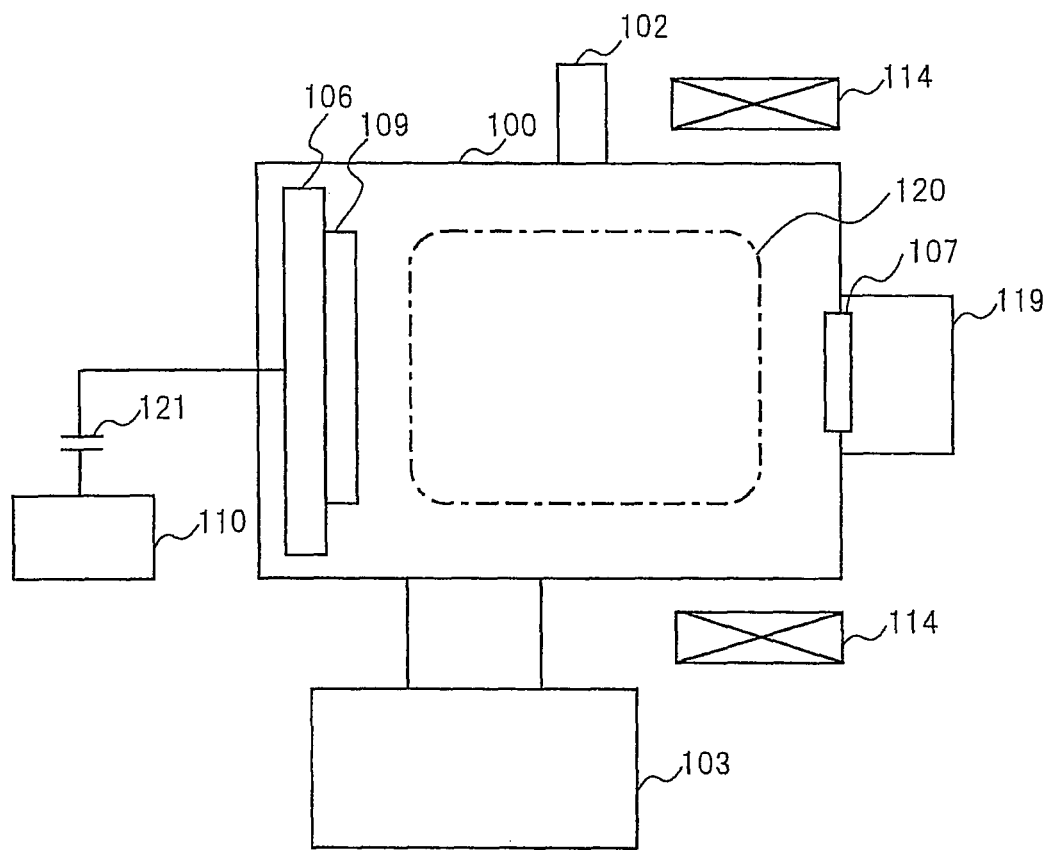
Figure 1:
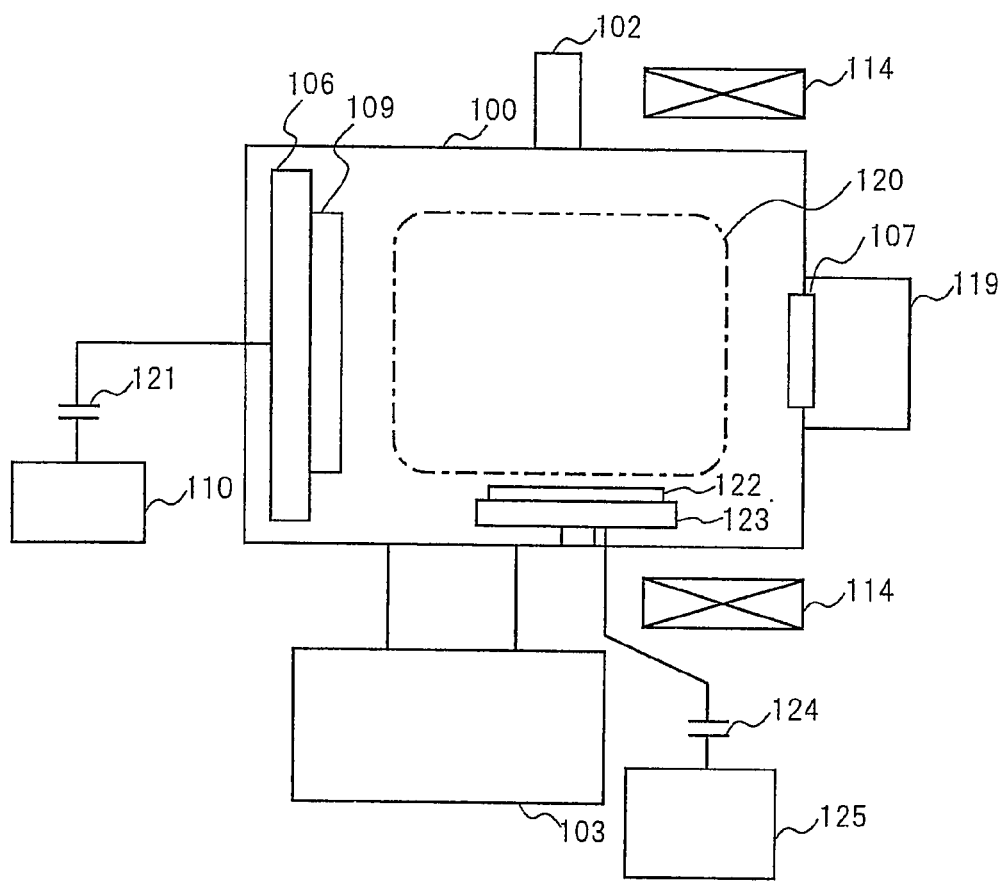

In FIG. 13, a predetermined gas is continuously introduced from a gas supplying apparatus 2 into a vacuum chamber 1, while the vacuum chamber 1 is evacuated by a turbo molecular pump 3 serving as an evacuating apparatus. In the state that the pressure of the vacuum chamber 1 is maintained at a predetermined value by means of a regulating valve 4, a high frequency electric power of 13.56 MHz is supplied from a high frequency power supply 5 to a coil 8 serving as a plasma generating apparatus provided in the vicinity of a dielectric window 7 opposing to a sample electrode 6. According to this configuration, inductively coupled plasma is generated in the vacuum chamber 1, so that plasma doping is performed on a silicon substrate 9 serving as a sample (work to be processed) placed on the sample electrode 6. A high frequency power supply 10 is provided for supplying a high frequency electric power to the sample electrode 6. Thus, the high frequency power supply 10 can control the electric potential of the sample electrode 6 such that the silicon substrate 9 has a negative potential relative to the plasma. The turbo molecular pump 3 and an evacuation opening 11 are arranged immediately under the sample electrode 6. The regulating valve 4 is arranged also immediately under the sample electrode 6 but immediately over the turbo molecular pump 3, and serves as a valve for increasing and reducing the pressure. The sample electrode 6 is mounted in the vacuum chamber 1 by four supporting members 12. The dielectric window 7 is composed mainly of quartz glass. When the forward power of the high frequency electric power supplied to the coil 8 serving as a plasma generating apparatus is denoted by Pf and when the reflected power thereof is denoted by Pr, a sampler 37 samples the power difference Pf-Pr in every interval of 1 millisecond through 100 milliseconds. When the integration of the power difference Pf-Pr with respect to time reaches a predetermined value, a controlling apparatus 44 stops the supply of the high frequency electric power. The present method utilizes the fact that the doping density is proportional to both the high frequency electric power supplied to the plasma generating apparatus and the processing time under the condition of the same gas species, the same gas flow rate, and the same gas pressure. Thus, at the time when the integration of the power difference Pf-Pr with respect to time reaches a predetermined value, the supply of the high frequency electric power is stopped. This provides more accurate doping density even in case that variation occurs in the generation of the reflection wave.

The seventh embodiment of the invention discloses merely an example of applicable forms of the plasma doping method according to the present invention. The plasma doping method according to the invention is obviously applicable to apparatuses of diverse variations with respect to the shape of the vacuum chamber, the scheme of the plasma source, and overall layout.

For example, the coil 8 may have a planar shape as shown in FIG. 2. Further, helicon wave plasma and magnetically neutral loop plasma may be used.

It is possible that no doping material gas is introduced into the vacuum chamber 1, and doping material generated from an impurity material of solid state may be used to dope impurities into a sample or into a film on the surface of the sample.

The plasma doping method according to the invention is useful especially in the case that at least one of control parameters, such as gas species, gas flow rate, pressure, and high frequency electric power is changed in the state that the plasma is generated. This is because the reflection wave is liable to be generated in the timing of the change of the control parameters.

The above-mentioned embodiment of the invention has been described for the case that the sample is a semiconductor substrate composed of silicon. However, the plasma doping method according to the invention is also applicable to the processing of samples composed of other various kinds of substances.

The above-mentioned embodiment of the invention has been described for the case that the impurities are composed of boron. However, in the case that the sample is a semiconductor substrate composed of silicon, the plasma doping method according to the invention is effective especially for the case that the impurities are composed of arsenic, phosphorus, boron, aluminum, and antimony. This is because these impurities can form a shallow junction in the transistor section.

The plasma doping method according to the invention is effective especially for the case of a low doping density. Specifically, the method is effective as a plasma doping method aiming at a doping density of $1\times10^{11}$ atm/cm$^2$ through $1\times10^{17}$ atm/cm$^2$. The method is more effective as a plasma doping method aiming at a doping density of $1\times10^{11}$ atm/cm$^2$ through $1\times10^{14}$ atm/cm$^2$. This is because in such low density doping, the processing time is as short as several seconds through ten and several seconds, and hence the influence due to variation of the reflection wave becomes large.

When the forward power of the high frequency electric power supplied to the plasma generating apparatus or the sample electrode is denoted by Pf and when the reflected power thereof is denoted by Pr, the sampling interval for the power difference Pf-Pr is preferably 1 millisecond through 100 milliseconds. A sampling interval less than 1 millisecond requires a sampler having extremely high performance and a controlling apparatus having high calculation capability, and hence causes an increase in the apparatus cost. A sampling interval greater than 100 milliseconds causes poor reproducibility.

When the forward power of the high frequency electric power supplied to the plasma generating apparatus or the sample electrode is denoted by Pf and when the reflected power thereof is denoted by Pr, the sampling interval for the power difference Pf-Pr is more preferably 1 millisecond through 10 milliseconds. A sampling interval less than 10 milliseconds results in excellent reproducibility.

In the sampling of the power difference Pf-Pr, each of Pf and Pr may be separately sampled so that their difference is calculated or alternatively obtained by means of operation in a circuit. Alternatively, assuming that the forward power Pf is equal to a setting value, the reflected power Pr alone may be sampled so that the power difference Pf-Pr is calculated.

Further, in the integration of the power difference Pf-Pr with respect to time, adjustment sampled values may be interpolated with a straight line. Alternatively, the sampled values may be treated such as to define a step-formed function

What is claimed is:

1. A plasma doping method for doping impurities into a sample or into a film on the surface of the sample, comprising:
   a first step of placing said sample on a sample electrode in a vacuum chamber;
   a second step of evacuating said vacuum chamber with supplying a gas comprising a doping material gas and helium into said vacuum chamber, and supplying a high frequency electric power to a plasma source with controlling the pressure of said vacuum chamber at a first pressure so as to generate plasma in said vacuum chamber; and
   a third step of controlling the pressure of said vacuum chamber into a second pressure different from said first pressure with maintaining the generation of the plasma, and supplying a high frequency electric power larger than the high frequency electric power in said second step to the plasma source,
   wherein a pressure just before the high frequency electric power is supplied to the plasma source at the second step is maintained to the first pressure, the pressure of said vacuum chamber is changed into the second pressure different from the first pressure at the third step, and the plasma is composed mainly of helium.

\* \* \* \* \*